(12) United States Patent
Hasegawa

(10) Patent No.: US 6,794,874 B2
(45) Date of Patent: Sep. 21, 2004

(54) MULTIPLE TUNING CIRCUIT AND PROBE HAVING MULTIPLE TUNING CIRCUIT FOR NMR SPECTROMETER

(75) Inventor: Kenichi Hasegawa, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 10/259,186

(22) Filed: Sep. 27, 2002

(65) Prior Publication Data

US 2003/0085706 A1 May 8, 2003

(30) Foreign Application Priority Data

| Sep. 27, 2001 | (JP) | 2001-296739 |
| Oct. 11, 2001 | (JP) | 2001-313487 |
| Feb. 7, 2002 | (JP) | 2002-030570 |
| Aug. 20, 2002 | (JP) | 2002-239176 |

(51) Int. Cl.[7] .............................................. G01V 3/00
(52) U.S. Cl. ................................................... 324/322
(58) Field of Search ................................ 324/300, 307, 324/309, 318, 321, 322, 302

(56) References Cited

U.S. PATENT DOCUMENTS 5,260,658 A * 11/1993 Greim et al. ............... 324/322

6,307,371 B1 * 10/2001 Zeiger ........................ 324/318
6,329,820 B1 * 12/2001 Hasegawa et al. .......... 324/315

OTHER PUBLICATIONS

"A Multinuclear Double–Tuned Probe for Applications With Solids or Liquids Utilizing Lumped Tuning Elements" of F. David Doty et al., *Journal of Magnetic Resonance* vol. 43, pp. 399–416 (1981).

* cited by examiner

Primary Examiner—Diego Gutierrez
Assistant Examiner—Dixomara Vargas
(74) Attorney, Agent, or Firm—Webb Ziesenheim Logsdon Orkin & Hanson, P.C.

(57) ABSTRACT

A multiple tuning circuit is offered which is for use in a nuclear magnetic resonance spectrometer and which has a resonant circuit having improved resistance to RF voltages. If high RF power is injected, electric discharge is unlikely to occur. A sample coil and inductors together form a balanced resonant circuit where the RF amplitude voltage becomes zero near the center point of the sample coil. Each of the inductors is connected with the sample coil via a capacitive element. An RF voltage produced across the sample coil and an RF voltage produced across each inductor are not added up.

32 Claims, 18 Drawing Sheets

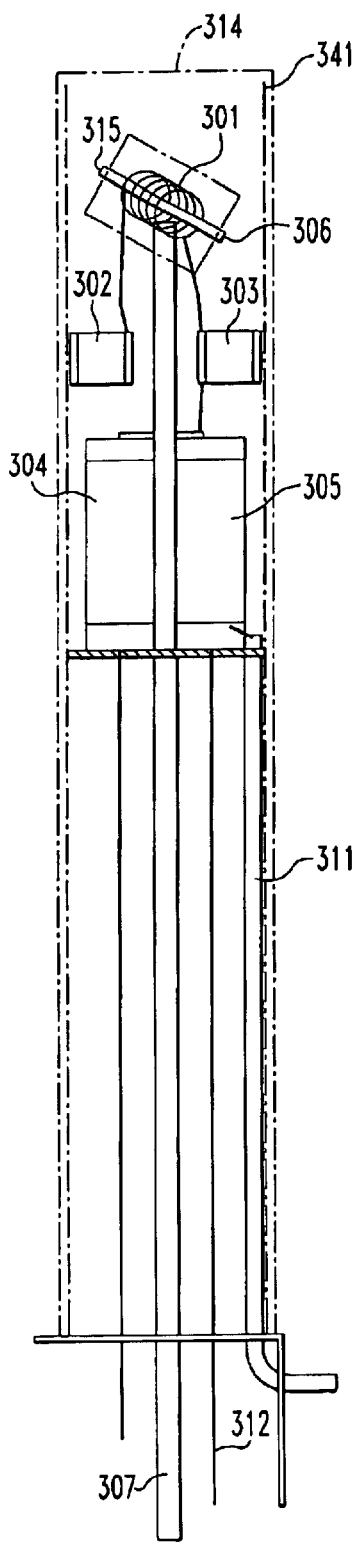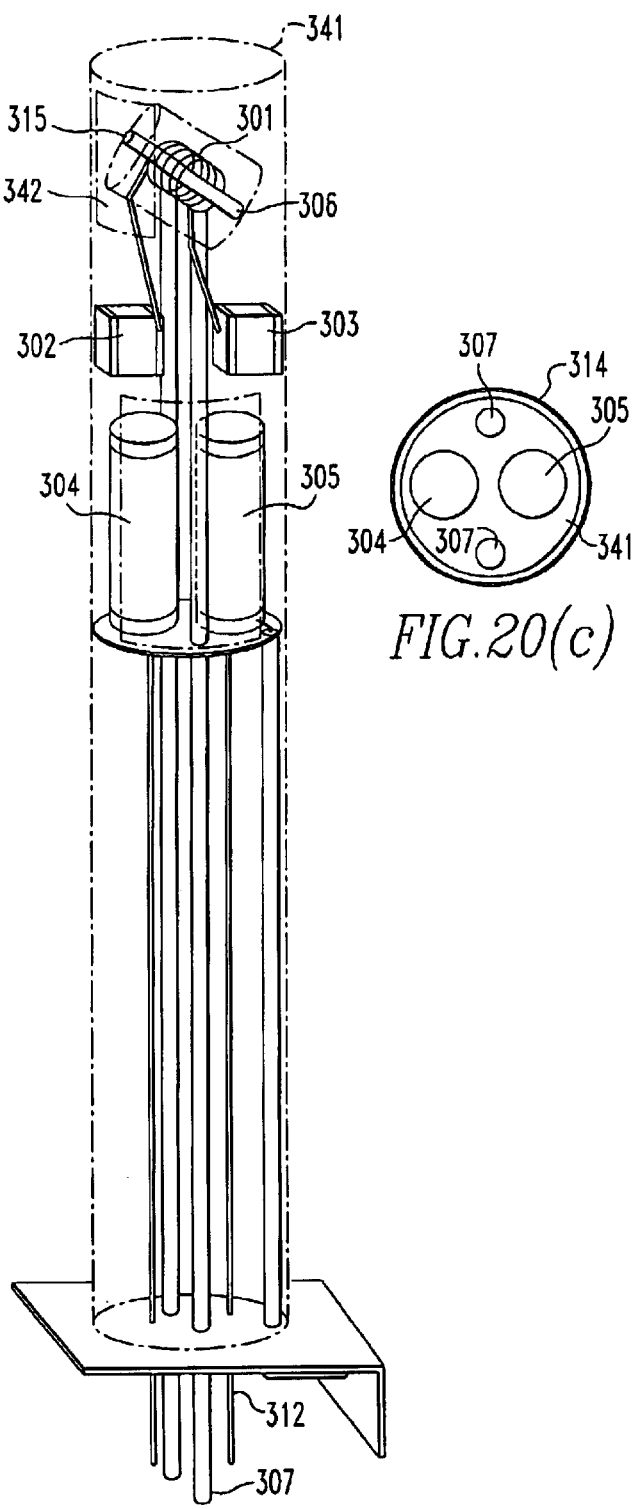
FIG.20(a)    FIG.20(b)    FIG.20(c)

MULTIPLE TUNING CIRCUIT AND PROBE HAVING MULTIPLE TUNING CIRCUIT FOR NMR SPECTROMETER

BACKGROUND OF THE INVENTION

1. Field of the Invention

The present invention relates to a multiple tuning circuit for use in a nuclear magnetic resonance (NMR) spectrometer and, more particularly, to such a multiple tuning circuit having improved resistance to RF voltages.

2. Description of Related Art

FIG. 1 shows a conventional multiple tuning circuit designed to irradiate two species of low-frequency resonating nuclei having resonant frequencies of LF1 and LF2, respectively, with RF signals simultaneously and to detect resulting NMR signals. The RF frequency LF1 is higher than the LF2. For example, LF1 corresponds to the resonant frequency of $^{13}C$ nucleus, while LF2 corresponds to the resonant frequency of $^{17}O$ nucleus.

In FIG. 1, a sample coil 1 consists of a solenoid coil or saddle coil. Inductors 2 and 3 are directly connected to the opposite ends of the sample coil 1. One end of the inductor 2 is connected with the sample coil 1, the other end being grounded via a capacitor 6 or directly. Similarly, one end of the inductor 3 is connected with the sample coil 1, the other end being grounded via a capacitor 9 or directly. In the illustrated example, the two inductors are grounded indirectly via capacitors.

The opposite ends of the sample coil 1 are grounded via two tuning capacitors 4 and 7, respectively, for LF1. A tuning variable capacitor 10 for LF1 is connected with one end of the sample coil 1 in a parallel relation to the tuning capacitor 7. The capacitance of the tuning capacitor 4 for LF1 is set almost equal to the sum of the capacitance of the tuning capacitor 7 for LF1 and the capacitance of the tuning variable capacitor 10 for LF1.

A tuning variable capacitor 12 for LF2 and a matching capacitor 13 for LF2 are connected with the grounded end of one of the inductors 2 and 3. For example, in the example of FIG. 1, the tuning variable capacitor 12 for LF2 and the matching capacitor 13 are connected with the grounded end of the inductor 3. The capacitance of the tuning capacitor 6 for LF2 is set almost equal to the sum of the capacitance of the tuning capacitor 9 and the tuning variable capacitor 12 for LF2.

Under this state, the sample coil 1, inductors 2, 3, tuning capacitors 6, 9, 4, and 7 together form a balanced resonant circuit where the voltage amplitude becomes zero near the center point of the sample coil 1. Each of the inductors 2 and 3 may be a lumped inductor, such as a helical coil fabricated by winding wire like a coil, or may be a distributed inductor, such as a conducting rod. That is, each of the inductors 2 and 3 may be any inductive component element.

The operation of this multiple tuning circuit is next described. FIG. 2 shows an equivalent circuit of the multiple tuning circuit when resonating at LF1. The tuning capacitors 6 and 9 corresponding to the resonant frequency LF2 have large capacitances and show sufficiently low impedances at the frequency of LF1. Therefore, the two inductors 2 and 3 are regarded to be connected in series as shown. Since the tuning capacitor 9 has a large capacitance, the contribution of the tuning variable capacitor 12 and matching variable capacitor 13 on the side of LF2 is small.

The series combination of the two inductors 2 and 3 is connected in parallel with the sample coil 1, thus forming a first resultant inductance. This resultant inductance and the tuning capacitors 4 and 7 corresponding to the resonant frequency LF1 together form a first LC resonant circuit. The tuning variable capacitor 10 and matching variable capacitor 11 on the side of the resonant frequency LF1 together act to tune and match the LC resonant circuit for the resonant frequency LF1. At some instant of time, tuning and matching are made at the resonant frequency LF1, and the resonant current maximizes. One example of the orientation of RF currents under this condition is indicated by the arrows 21 and 22.

An equivalent circuit of the multiple tuning circuit resonating at LF2 is shown in FIG. 3. The tuning capacitors 4 and 7 for the resonant frequency LF1 have small capacitances and show sufficiently large impedances at the frequency of LF2. Therefore, the contribution of the two tuning capacitors 4 and 7 is small. Furthermore, the contribution of the tuning variable capacitor 10 and matching variable capacitor 11 on the side of the resonant frequency LF1 is small, because their capacitances are small.

The inductor 2, sample coil 1, and inductor 3 are connected in turn and in series to thereby form a second resultant inductance. This second resultant inductance and the tuning capacitors 6, 9 for the resonant frequency LF2 together form a second LC resonant circuit. The tuning variable capacitor 12 and matching variable capacitor 13 on the side of the resonant frequency LF2 make tuning and matching at the resonant frequency LF2.

At some instant of time, tuning and matching are made at the resonant frequency LF2, and the resonant current maximizes. One example of the orientation of an RF current under this condition is indicated by the arrow 31.

FIG. 3 indicates an equivalent circuit of the multiple tuning circuit when resonating at the frequency LF2. In this equivalent circuit configuration, the inductor 2, sample coil 1, and inductor 3 are connected in series to form the resultant inductance. Therefore, when an RF current 31 flows, an RF voltage developed across the inductor 2, an RF voltage developed across the sample coil 1, and an RF voltage developed across the inductor 3 are added up. Consequently, a quite high RF voltage relative to ground potential is generated at positions 32 and 33. As a result, electric discharge tends to be produced across each of the positions 32 and 33 and ground. Once such electric discharge occurs, electronic parts, such as capacitors, are burned out. Hence, expensive repair cost is necessary.

SUMMARY OF THE INVENTION

In view of the foregoing problems, it is an object of the present invention to provide a multiple tuning circuit which is for use in an NMR spectrometer and has improved voltage resistance and thus is less likely to produce electric discharge even if high RF power is injected.

To achieve this object, the present invention provides a multiple tuning circuit for use in an NMR spectrometer, the tuning circuit comprising: a sample coil having ends A and B, the end A being grounded via a first capacitive element, the end B being grounded via a second capacitive element; a first inductor having one end connected with the end A of the sample coil via a third capacitive element, the other end being grounded; a second inductor having one end connected with the end B of the sample coil via a fourth capacitive element, the other end being grounded; a first set of matching circuit and tuning circuit for supplying first RF to the sample coil; and a second set of matching circuit and tuning circuit for supplying second RF to the sample coil.

This multiple tuning circuit is characterized in that the sample coil, first inductor, second inductor, first capacitive element, second capacitive element, third capacitive element, and fourth capacitive element together form a balanced resonant circuit where the amplitude voltage becomes zero near the center point of the sample coil.

In one feature of the multiple tuning circuit, the grounded end of the first inductor is grounded via a fifth capacitive element.

In another feature of the multiple tuning circuit, the grounded end of the second inductor is grounded via a sixth capacitive element.

In a further feature of the multiple tuning circuit, the first set of matching circuit and tuning circuit is directly connected with one end of the sample coil.

In still another feature of the multiple tuning circuit, the second set of matching circuit and tuning circuit is connected between the first inductor and the fifth capacitive element or between the second inductor and the sixth capacitive element.

In yet another feature of the multiple tuning circuit, at least one of the third and fourth capacitive elements is a tuning variable capacitive element for the second RF.

In an additional feature of the multiple tuning circuit, the tuning variable capacitive element for the second RF has one end connected with the junction of the sample coil and the second capacitive element, the other end being connected with the second inductor. The junction of the tuning variable capacitive element for the second RF and the second inductor is grounded via an eighth capacitive element for bringing the first RF into resonance.

In an additional feature of the multiple tuning circuit, the third capacitive element connected with the end A of the sample coil is split into at least two parts connected in series. One end of the first capacitive element and one end of the first set of matching circuit and tuning circuit are connected with the junction of these parts connected in series. The other end of the first capacitive element and the other end of the first set of matching circuit and tuning circuit are grounded. The fourth capacitive element connected with the end B of the sample coil is split into at least two parts connected in series. One end of the second capacitive element for bringing the first RF into resonance is connected with the junction of these parts connected in series. The other end of the second capacitive element is grounded.

In an additional feature of the multiple tuning circuit, a capacitive element of a variable or fixed capacitance is connected in parallel with at least one of the first and second inductors.

The present invention also provides a multiple tuning circuit for use in an NMR spectrometer, the tuning circuit comprising: a sample coil having ends A and B; a first inductor having one end connected with the end A of the sample coil via first and second capacitive elements, the other end being grounded; a second inductor having one end connected with the end B of the sample coil via third and fourth capacitive elements, the other end being grounded; one or more fifth capacitive elements for connecting the junction of the first and second capacitive elements with the junction of the third and fourth capacitive elements directly or indirectly via ground; a first matching circuit for supplying first RF to the sample coil; and a second matching circuit for supplying second RF to the sample coil. This multiple tuning circuit is characterized in that the sample coil, first inductor, second inductor, first capacitive element, second capacitive element, third capacitive element, and fourth capacitive element together form a balanced resonant circuit where the amplitude voltage becomes zero near the center point of the sample coil.

In one feature of this multiple tuning circuit, the grounded end of the first inductor is grounded via a sixth capacitive element.

In another feature of the multiple tuning circuit, the grounded end of the second inductor is grounded via a seventh capacitive element.

In a further feature of this multiple tuning circuit, at least one of the first through fourth capacitive elements is a tuning variable capacitive element for the second RF.

In a still further feature of the multiple tuning circuit, at least one of the fifth capacitive elements is a tuning variable capacitive element for the first RF.

In still another feature of the multiple tuning circuit, a capacitive element having a fixed or variable capacitance is connected in parallel with at least one of the first and second inductors.

In yet another feature of the multiple tuning circuit, the first RF is higher in frequency than the second RF.

Furthermore, the present invention provides a multiple tuning circuit for use in an NMR spectrometer, the tuning circuit comprising: a sample coil having ends A and B; a second inductor having one end connected with the end A of the sample coil via a first capacitive element, a first inductor and a second capacitive element, the other end being grounded; a fourth inductor having one end connected with the end B of the sample coil via a third capacitive element, a third inductor, and a fourth capacitive element; one or more fifth capacitive elements for connecting the junction of the first inductor and the second capacitive element with the junction of the third inductor and the fourth capacitive element directly or indirectly via ground; a first matching circuit for supplying first RF to the sample coil; a second matching circuit for supplying second RF to the sample coil; and a third matching circuit for supplying third RF to the sample coil. This multiple tuning circuit is characterized in that the sample coil, first inductor, second inductor, third inductor, fourth inductor, first capacitive element, second capacitive element, third capacitive element, and fourth capacitive element together form a balanced resonant circuit where the amplitude voltage becomes zero near the center point of the sample coil.

In one feature of this multiple tuning circuit, the grounded end of the second inductor is grounded via a sixth capacitive element.

In another feature of this multiple tuning circuit, the grounded end of the fourth inductor is grounded via a seventh capacitive element.

In still another feature of this multiple tuning circuit, at least one of the first through fourth capacitive elements is a tuning variable capacitive element for the second RF.

In yet another feature of this multiple tuning circuit, at least one capacitive element of the fifth capacitive elements is a tuning variable capacitive element for the first RF.

In an additional feature of this multiple tuning circuit, a tuning capacitive element for the third RF is formed at least in a given position in the first inductor or in a given position in the third inductor.

In an additional feature of this multiple tuning circuit, a capacitive element having a variable or fixed capacitance is connected in parallel with at least one of the second and fourth inductors.

In an additional feature of this multiple tuning circuit, a band-reject filter for rejecting the second RF is inserted between an input terminal for the first RF and a matching capacitive element.

In an additional feature of this multiple tuning circuit, a band-reject filter for rejecting the first RF is inserted between an input terminal for the second RF and a matching capacitive element.

In an additional feature of this multiple tuning circuit, the third RF is higher in frequency than the first RF. The first RF is higher in frequency than the second RF.

In addition, the present invention provides a probe for use in an NMR spectrometer, said probe including a multiple tuning circuit which comprises: a sample coil having ends A and B, the end A being grounded via a first capacitive element, the end B being grounded via a second capacitive element; a first inductor having one end connected with the end A of the sample coil via a third capacitive element, the other end being grounded; a second inductor having one end connected with the end B of the sample coil via a fourth capacitive element, the other end being grounded; a first set of matching circuit and tuning circuit for supplying first RF to the sample coil; and a second set of matching circuit and tuning circuit for supplying second RF to the sample coil. The multiple tuning circuit has an electrical circuit portion whose outside is surrounded by a cylindrical electrode that is used as a grounding electrode of the multiple tuning circuit.

Moreover, the present invention provides a probe for use in an NMR spectrometer, the probe including a multiple tuning circuit which comprises: a sample coil having ends A and B; a first inductor having one end connected with the end A of the sample coil via first and second capacitive elements, the other end being grounded; a second inductor having one end connected with the end B of the sample coil via third and fourth capacitive elements, the other end being grounded; one or more fifth capacitive elements for connecting the junction of the first capacitive element and the second capacitive element with the junction of the third and fourth capacitive elements directly or indirectly via ground; a first matching circuit for supplying first RF to the sample coil; and a second matching circuit for supplying second RF to the sample coil. The multiple tuning circuit has an electrical circuit portion whose outside is surrounded by a cylindrical electrode that is used as a grounding electrode of the multiple tuning circuit.

Additionally, the present invention provides a probe for use in an NMR spectrometer, the probe including a multiple tuning circuit which comprises: a sample coil having ends A and B; a second inductor having one end connected with the end A of the sample coil via a first capacitive element, a first inductor, and a second capacitive element, the other end being grounded; a fourth inductor having one end connected with the end B of the sample coil via a third capacitive element, a third inductor, and a fourth capacitive element, the other end being grounded; one or more fifth capacitive elements for connecting the junction of the first inductor and the second capacitive element with the junction of the third inductor and the fourth capacitive element directly or indirectly via ground; a first matching circuit for supplying first RF to the sample coil; a second matching circuit for supplying second RF to the sample coil; and a third matching circuit for supplying third RF to the sample coil. The multiple tuning circuit has an electrical circuit portion surrounded by a cylindrical electrode that is used as a grounding electrode for the multiple tuning circuit.

In one feature of this probe, the cylindrical electrode has a window in a given position to place the inside of the probe in communication with the outside.

Further, the present invention provides a probe for use in an NMR spectrometer, the probe comprising: a sample coil having ends A and B; a first capacitor having one end connected with the end A of the sample coil, the other end being grounded; and a second capacitor having one end connected with the end B of the sample coil, the other end being grounded. The sample coil, first capacitor, and second capacitor together form a balanced resonant circuit for bringing RF amplitude voltage near the center point of the sample coil to zero. The multiple tuning circuit has an electrical circuit portion whose outside is surrounded by a cylindrical electrode that is used as a grounding electrode of the electrical circuit portion.

In one feature of this probe, the cylindrical electrode has a window in a given position to place the inside of the probe in communication with the outside.

Other objects and features of the present invention will appear in the course of the description thereof, which follows.

BRIEF DESCRIPTION OF THE DRAWINGS

FIGS. 20(a), 20(b), and 20(c) show one embodiment of the MQMAS probe according to the present invention.

DESCRIPTION OF THE PREFERRED EMBODIMENTS

Figure 1:
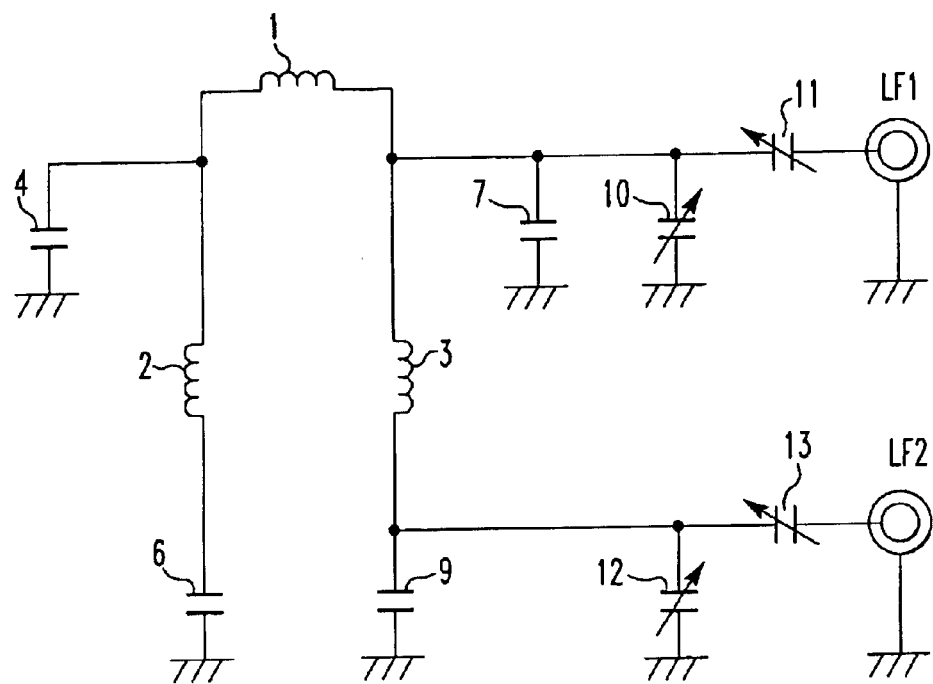
FIG. 1 is a diagram showing a conventional multiple tuning circuit for use in an NMR spectrometer.
Figure 2:
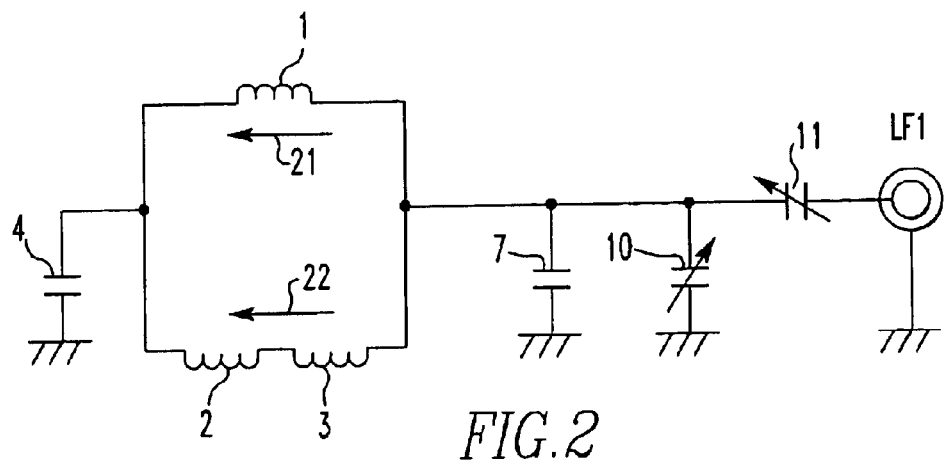
FIG. 2 is a diagram showing one example of resonant state of the conventional multiple tuning circuit shown in FIG. 1.
Figure 3:
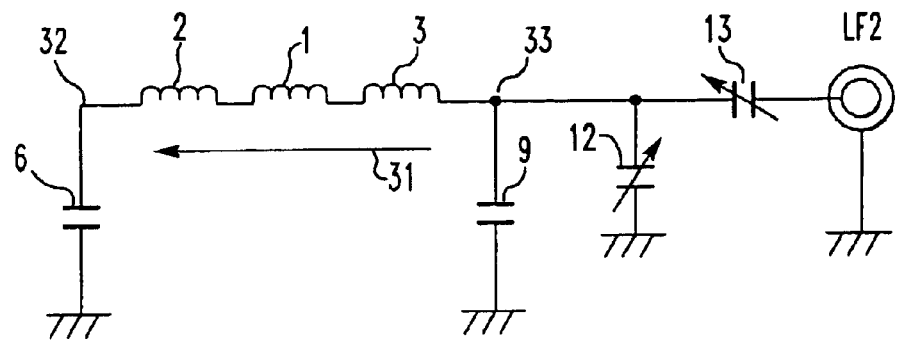
FIG. 3 is a diagram showing another example of resonant state of the conventional multiple tuning circuit shown in FIG. 1.
Figure 4:
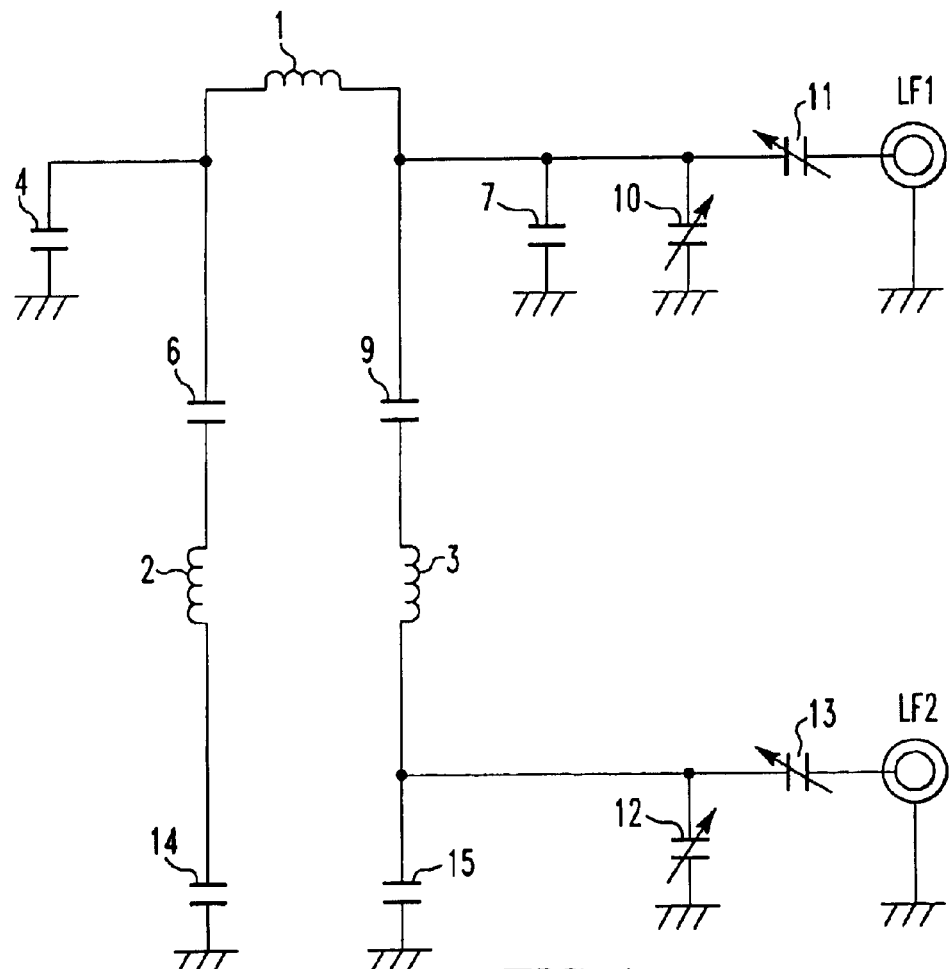
FIG. 4 is a diagram showing one embodiment of the multiple tuning circuit of the present invention.

Embodiments of the present invention are hereinafter described with reference to the accompanying drawings. FIG. 4 shows one embodiment of the multiple tuning circuit according to the present invention, the tuning circuit being for use in a nuclear magnetic resonance (NMR) spectrometer. The multiple tuning circuit is designed to irradiate two species of low-frequency resonating nuclei having resonant frequencies of LF1 and LF2, respectively, with RF signals simultaneously and to detect resulting NMR signals. The RF frequency LF1 is higher than LF2. For example, LF1 corresponds to the resonant frequency of $^{13}C$ nucleus, while LF2 corresponds to the resonant frequency of $^{17}O$ nucleus.

In FIG. 4, a sample coil 1 consists of a solenoid coil or saddle coil. Inductors 2 and 3 are indirectly connected to the opposite ends of the sample coil 1 via two tuning capacitors 6 and 9, respectively, for the resonant frequency LF2. The other ends of the inductors 2 and 3 are directly grounded or indirectly grounded via capacitors 14 and 15, respectively, having a capacitance larger than that of the capacitors 6 and 9. In the illustrated embodiment, the two inductors are grounded indirectly by capacitors 14 and 15.

The opposite ends of the sample coil 1 are grounded via two tuning capacitors 4 and 7, respectively, for nuclei having the resonant frequency LF1. A tuning variable capacitor 10 for LF1 nuclei is connected with one end of the sample coil 1 in parallel with the tuning capacitor 7. The capacitance of the tuning capacitor 4 for LF1 nuclei is set almost equal to the sum of the capacitance of the tuning capacitor 7 for LF1 nuclei and the capacitance of the tuning variable capacitor 10.

A tuning variable capacitor 12 for LF2 nuclei and a tuning variable capacitor 13 are connected with the grounded end of one of the inductors 2 and 3. For example, in the embodiment of FIG. 4, the tuning variable capacitor 12 for LF2 nuclei and the tuning variable capacitor 13 are connected with the grounded end of the inductor 3. The capacitors 6 and 9 are set almost equal in capacitance. The sum of the capacitance of the capacitor 15 and the capacitance of the variable capacitor 12 is set almost equal to the capacitance of the capacitor 14.

Under this state, the sample coil 1, inductors 2, 3, and tuning capacitors 6, 9, 4, 7, 14, and 15 together form a balanced resonant circuit where the amplitude voltage becomes zero near the center point of the sample coil 1. Each of the inductors 2 and 3 may be a lumped inductor, such as a helical coil fabricated by winding wire like a coil, or may be a distributed inductor, such as a conducting rod. That is, each of the inductors 2 and 3 may be any inductive component element.

Figure 5:
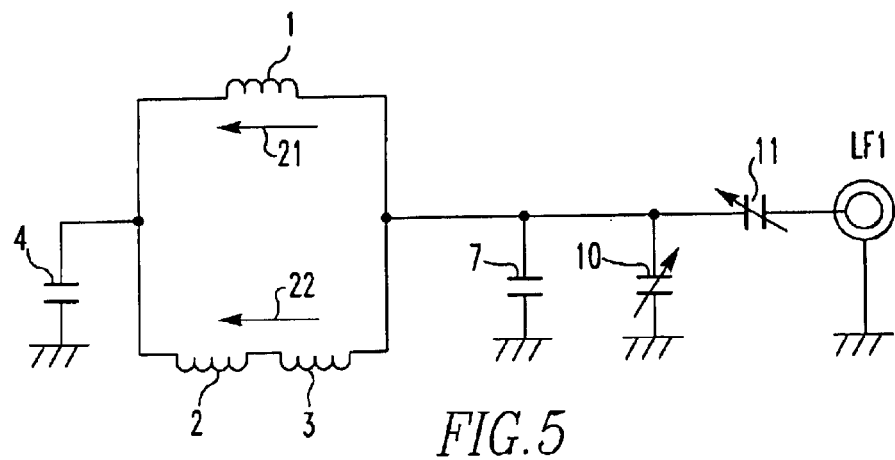
FIG. 5 is a diagram showing one example of resonant state of the multiple tuning circuit shown in FIG. 4.

The operation of this multiple tuning circuit is next described. FIG. 5 shows an equivalent circuit of the multiple tuning circuit when resonated at LF1. The four tuning capacitors 6, 9, 14, and 15 corresponding to the resonant frequency LF2 have large capacitances and show sufficiently low impedances at the frequency of LF1. Therefore, the two inductors 2 and 3 are regarded to be connected in series as shown. Since the tuning capacitor 15 has a large capacitance, the contribution of the tuning variable capacitor 12 and matching variable capacitor 13 on the side of the resonant frequency LF2 is small.

The series combination of the two inductors 2 and 3 is connected in parallel with the sample coil 1, thus forming a first resultant inductance. This resultant inductance and the tuning capacitors 4 and 7 for the resonant frequency LF1 together form a first LC resonant circuit. The tuning variable capacitor 10 and matching variable capacitor 11 on the side of the resonant frequency LF1 together act to tune and match the LC resonant circuit for the resonant frequency LF1. At some instant of time, tuning and matching are made at the resonant frequency LF1, and the resonant current maximizes. One example of the orientation of RF current under this condition is indicated by the arrows 21 and 22.

Figure 6:
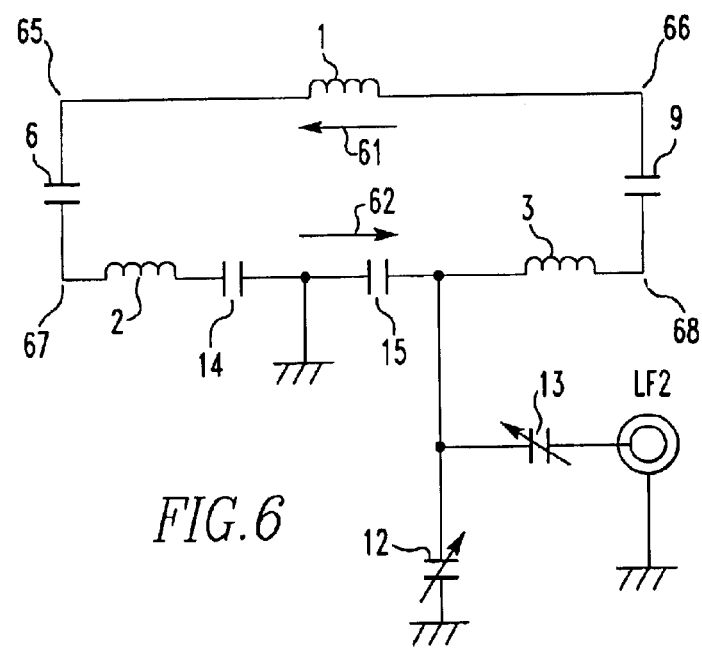
FIG. 6 is a diagram showing another example of resonant state of the multiple tuning circuit shown in FIG. 4.

An equivalent circuit of the multiple tuning circuit resonate at LF2 is shown in FIG. 6. The tuning capacitors 4 and 7 for the resonant frequency LF1 have small capacitances and show sufficiently large impedances at the frequency of LF2. Therefore, the contribution of the two tuning capacitors 4 and 7 is small. Furthermore, the contribution of the tuning variable capacitor 10 and matching variable capacitor 11 on the side of the resonant frequency LF1 is small, because their capacitances are small.

The capacitor 14, inductor 2, capacitor 6, sample coil 1, capacitor 9, inductor 3, and capacitor 15 are connected in turn and in series to thereby form a second resultant inductance. The tuning variable capacitor 12 and matching variable capacitor 13 on the side of the resonant frequency LF2 act to tune and match this LC resonant circuit.

At some instant of time, tuning and matching are made at the resonant frequency LF2, and the resonant current maximizes. One example of the orientation of RF current under this condition is indicated by the arrows 61 and 62.

At this time, an RF voltage is developed across the inductor 2. Since its one end is grounded via the capacitor 14 having a capacitance larger than that of the capacitors 6 and 9, only a voltage corresponding to the RF voltage developed across the inductor 2 is produced at position 67. Similarly, an RF voltage is developed across the inductor 3. Its one end is grounded via the capacitor 15 having a capacitance larger than that of the capacitors 6 and 9. Therefore, only a voltage corresponding to the RF voltage developed across the inductor 3 is produced at position 68. Since the LC resonant circuit of FIG. 6 is a balanced resonant circuit, the center point of the sample coil 1 is near zero potential. Only half of the RF voltage developed across the sample coil 1 is generated at positions 65 and 66. Consequently, the RF voltage developed across the inductor 2, the RF voltage developed across the sample coil 1, and the RF voltage developed across the inductor 3 are not summed up.

A large RF voltage difference is applied to each of the tuning capacitors 6 and 9. Plural capacitors are connected in series in use to divide the RF voltage, thus preventing electric discharge.

Figure 7:
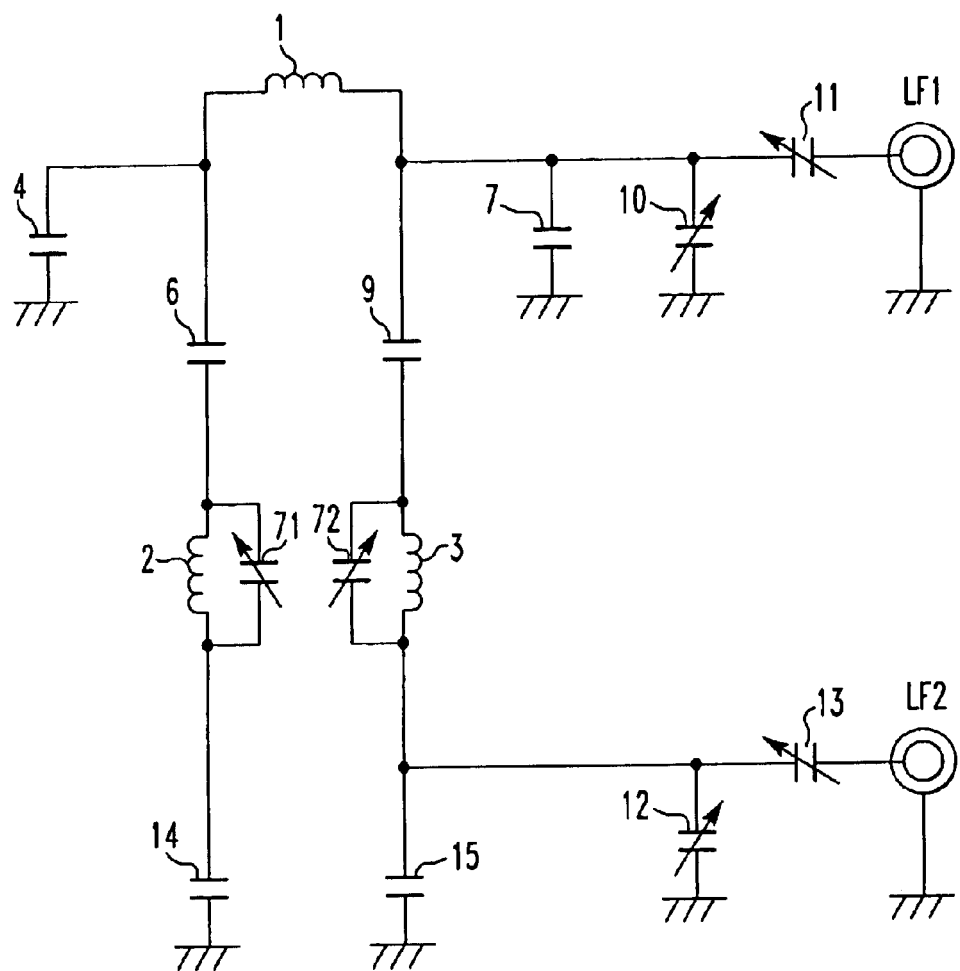
FIG. 7 is a diagram showing another embodiment of the multiple tuning circuit of the present invention.

It is to be noted that the present invention is not limited to the above embodiment and that various changes and modifications are possible. For example, FIG. 7 shows another embodiment of the multiple tuning circuit according to the present invention, the tuning circuit being for use in an NMR spectrometer. This multiple tuning circuit is designed to irradiate two species of low-frequency resonating nuclei having resonant frequencies of LF1 and LF2, respectively, with RF signals simultaneously and to detect resulting NMR signals. The RF frequency LF1 is higher than LF2. For example, LF1 corresponds to the resonant frequency of $^{13}C$ nucleus, while LF2 corresponds to the resonant frequency of $^{17}O$ nucleus.

In FIG. 7, a sample coil 1 consists of a solenoid coil or saddle coil. Inductors 2 and 3 are indirectly connected to the opposite ends of the sample coil 1 via tuning capacitors 6 and 9, respectively, for LF2. The other ends of the inductors 2 and 3 are directly grounded or indirectly grounded via capacitors 14 and 15, respectively, for LF2. In the illustrated embodiment, the two inductors are indirectly grounded.

The opposite ends of the sample coil 1 are grounded via two tuning capacitors 4 and 7, respectively, for the resonant frequency LF1. A tuning variable capacitor 10 for the resonant frequency LF1 is connected with one end of the sample coil 1 in a parallel relation to the tuning capacitor 7. The capacitance of the tuning capacitor 4 for the resonant frequency LF1 is set almost equal to the sum of the capacitance of the tuning capacitor 7 for LF1 and the capacitance of the tuning variable capacitor 10.

A tuning variable capacitor 12 for LF2 and a tuning variable capacitor 13 for the resonant frequency LF2 are connected with the grounded end of one of the inductors 2 and 3. For example, in the embodiment of FIG. 7, the tuning variable capacitor 12 for LF2 and the tuning variable capacitor 13 for LF2 are connected with the grounded end of the inductor 3. The capacitors 6 and 9 are set almost equal in capacitance. The sum capacitance of the capacitor 15 and variable capacitor 12 is set almost equal to the capacitance of the capacitor 14.

Under this state, the sample coil 1, inductors 2, 3, and tuning capacitors 6, 9, 4, 7, 14, and 15 together form a balanced resonant circuit where the amplitude voltage becomes zero near the center point of the sample coil 1. Each of the inductors 2 and 3 may be a lumped inductor, such as a helical coil fabricated by winding wire like a coil, or may be a distributed inductor, such as a conducting rod. That is, each of the inductors 2 and 3 may be any inductive component element.

In this embodiment, variable capacitive elements 71 and 72 are connected in parallel with the inductors 2 and 3, respectively. A parallel resonant circuit for LF1 is formed by appropriately setting the values of the variable capacitive elements 71 and 72. Transmission of RF power of LF1 to the side of the tuning and matching circuit for LF2 is prevented. Consequently, when tuning and matching are made on the side of LF2, if the capacitances of the variable capacitors 12 and 13 are varied, the circuit side of LF1 is hardly affected.

Obviously, this usage of the variable capacitive elements 71 and 72 is not limited to the method illustrated in FIG. 7. The usage may also be applied to inductors employed in the embodiments illustrated in FIGS. 8–10.

Figure 8:
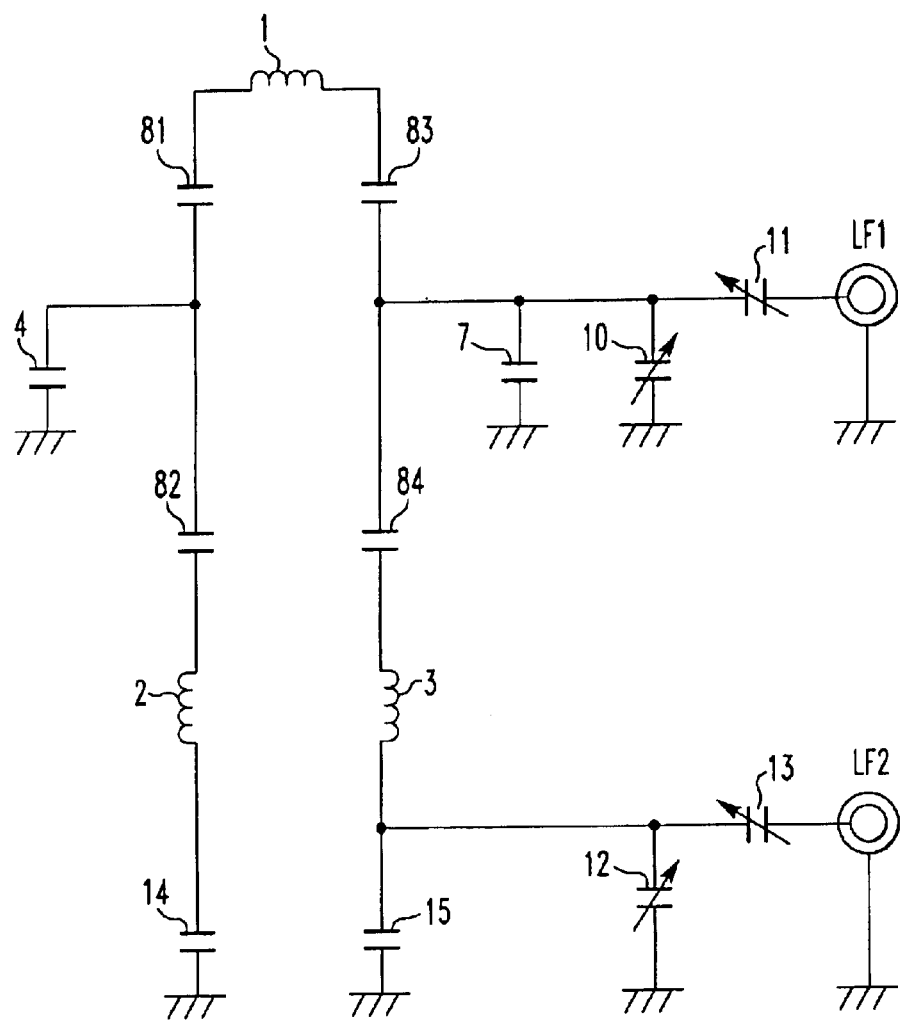
FIG. 8 is a diagram showing a further embodiment of the multiple tuning circuit of the present invention.

FIG. 8 shows a further embodiment of the multiple tuning circuit according to the invention, the tuning circuit being for use in an NMR spectrometer. The tuning circuit is designed to irradiate two species of low-frequency resonating nuclei having resonant frequencies of LF1 and LF2, respectively, with RF signals simultaneously and to detect resulting NMR signals. The RF frequency LF1 is higher than LF2. For example, LF1 corresponds to the resonant frequency of $^{13}C$ nucleus, while LF2 corresponds to the resonant frequency of $^{17}O$ nucleus.

In FIG. 8, a sample coil 1 consists of a solenoid coil or saddle coil. An inductor 2 is indirectly connected with one end of the sample coil 1 via two tuning capacitors 81 and 82 for LF2. Similarly, another inductor 3 is connected with the other end of the sample coil 1 via two tuning capacitors 83 and 84 for LF2. The other ends of the inductors 2 and 3 are directly grounded or indirectly grounded via tuning capacitors 14 and 15, respectively, for LF2. In the illustrated embodiment, the two inductors are grounded indirectly.

Under this state, the sample coil 1, inductors 2, 3, and tuning capacitors 4, 7, 14, 15, 81, 82, 83, and 84 together form a balanced resonant circuit where the amplitude voltage becomes zero near the center point of the sample coil 1. Each of the inductors 2 and 3 may be a lumped inductor, such as a helical coil fabricated by winding wire like a coil, or may be a distributed inductor, such as a conducting rod. That is, each of the inductors 2 and 3 may be any inductive component element.

In this embodiment, the two tuning capacitors connected to the opposite ends of the sample 1 and corresponding to LF2 are each divided into two parts, which are connected in series. One end of the tuning capacitor 4 for LF1 is connected with the junction of the capacitors 81 and 82 connected in series. The other end of the tuning capacitor 4 is grounded. Similarly, the respective one end of the tuning capacitor 7, tuning variable capacitor 10, and tuning variable capacitor 11 for LF1 is connected with the junction of the capacitors 83 and 84 connected in series. The respective other end of the tuning capacitor 7, tuning variable capacitor 10, and tuning variable capacitor 11 is grounded. When a resonance occurs at the resonant frequency LF2, the RF amplitude voltage becomes almost zero near the junction of the tuning capacitors 83 and 84 with which the tuning and matching circuits on the LF1 side are connected. The potential becomes almost equal to ground potential. As a result, when tuning and matching are made at the frequency LF1, the LF2 side is hardly affected if the capacitances of the variable capacitors 10 and 11 are varied.

Figure 9:
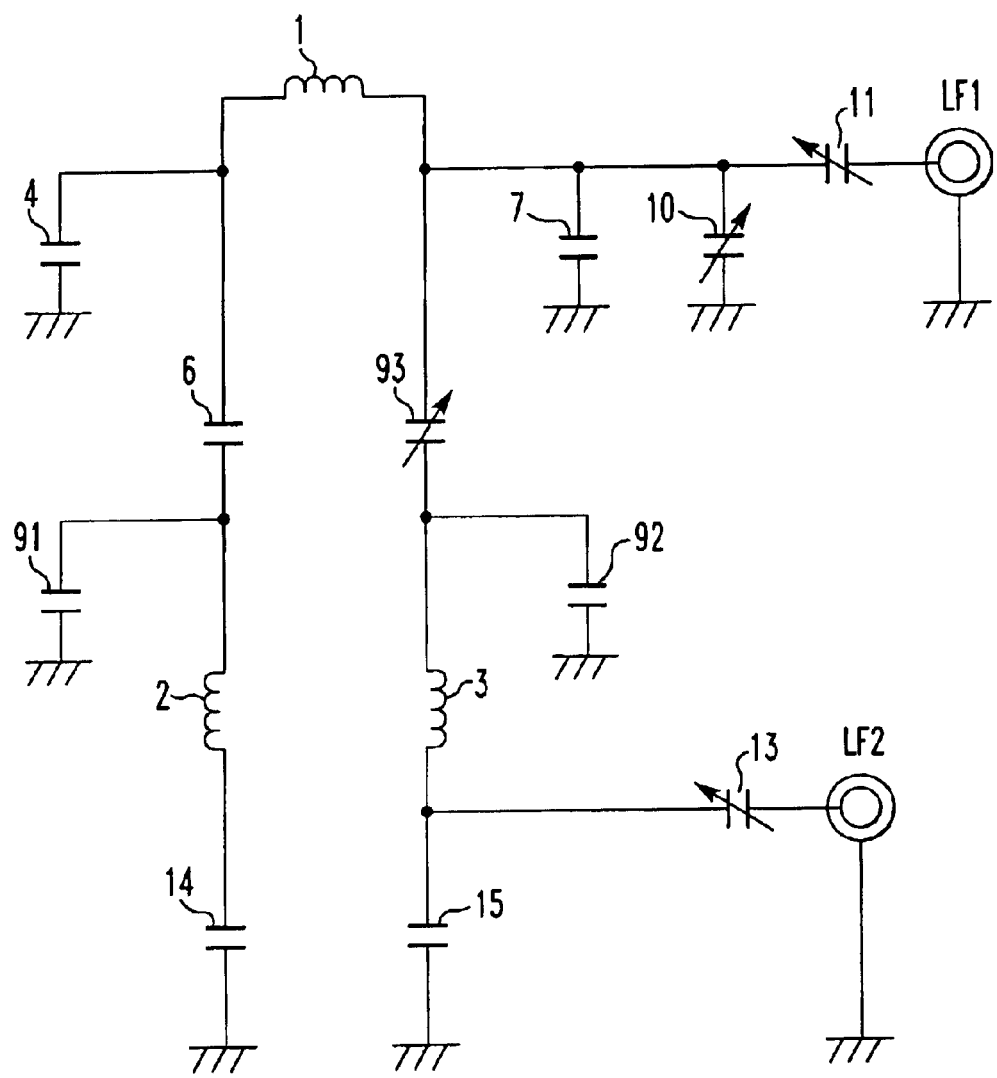
FIG. 9 is a diagram showing still another embodiment of the multiple tuning circuit of the present invention.

Referring next to FIG. 9, there is shown a further embodiment of the multiple tuning circuit according to the present invention, the tuning circuit being for use in an NMR spectrometer. The multiple tuning circuit is designed to irradiate two species of low-frequency resonating nuclei having resonant frequencies of LF1 and LF2, respectively, with RF signals simultaneously and to detect resulting NMR signals. The RF frequency LF1 is higher than LF2. For example, LF1 corresponds to the resonant frequency of $^{13}C$ nucleus, while LF2 corresponds to the resonant frequency of $^{17}O$ nucleus.

In FIG. 9, a sample coil 1 consists of a solenoid coil or saddle coil. Inductors 2 and 3 are indirectly connected to the opposite ends of the sample coil 1 via two tuning capacitors 6 and 93, respectively, for resonant frequency LF2. The other ends of the inductors 2 and 3 are directly grounded or indirectly grounded via capacitors 14 and 15, respectively, for LF2. In the illustrated embodiment, the two inductors are grounded indirectly.

The tuning capacitors 6 and 93 for LF2 may be interchanged in position. Furthermore, the tuning capacitor 6 may be replaced by a tuning variable capacitor for LF2 such that this replacing variable capacitor and the tuning variable capacitor 93 make a pair.

Each of the inductors 2 and 3 may be a lumped inductor, such as a helical coil fabricated by winding wire like a coil, or may be a distributed inductor, such as a conducting rod. That is, each of the inductors 2 and 3 may be any inductive component element.

Under this state, the sample coil 1, inductors 2, 3, and tuning capacitors 4, 7, 91, 92, 14, 15, 6, and the tuning variable capacitor 93 together form a balanced resonant circuit where the amplitude voltage becomes zero near the center point of the sample coil 1.

In this embodiment, the resonant frequencies LF1 and LF2 of the circuitry can be adjusted more practically by inserting the tuning variable capacitor for LF2 between the sample coil 1 and the inductor 2. More specifically, to make tuning at the frequencies LF1 and LF2, the network portion consisting of the sample coil 1 and the tuning capacitors 4, 7 is first tuned to the frequency LF1 using the tuning variable capacitor 10 and matching variable capacitor 11. Then, the network portion consisting of the tuning capacitors 91, 92, inductors 2, 3, and tuning capacitors 14, 15 is tuned to the frequency LF1 using the matching variable capacitor 13. Finally, the network portion consisting of the sample coil 1 and tuning capacitors 4, 7 and the network portion consisting of the tuning capacitors 91, 92, inductors 2, 3, and tuning capacitors 14, 15 are spliced together. The whole configuration is tuned to the frequency LF2 using the tuning variable capacitor 93. In this way, tuning is made at LF1 and LF2 by three stages of process. Consequently, complex adjustment of the whole multiple tuning circuit can be performed efficiently.

Figure 10:
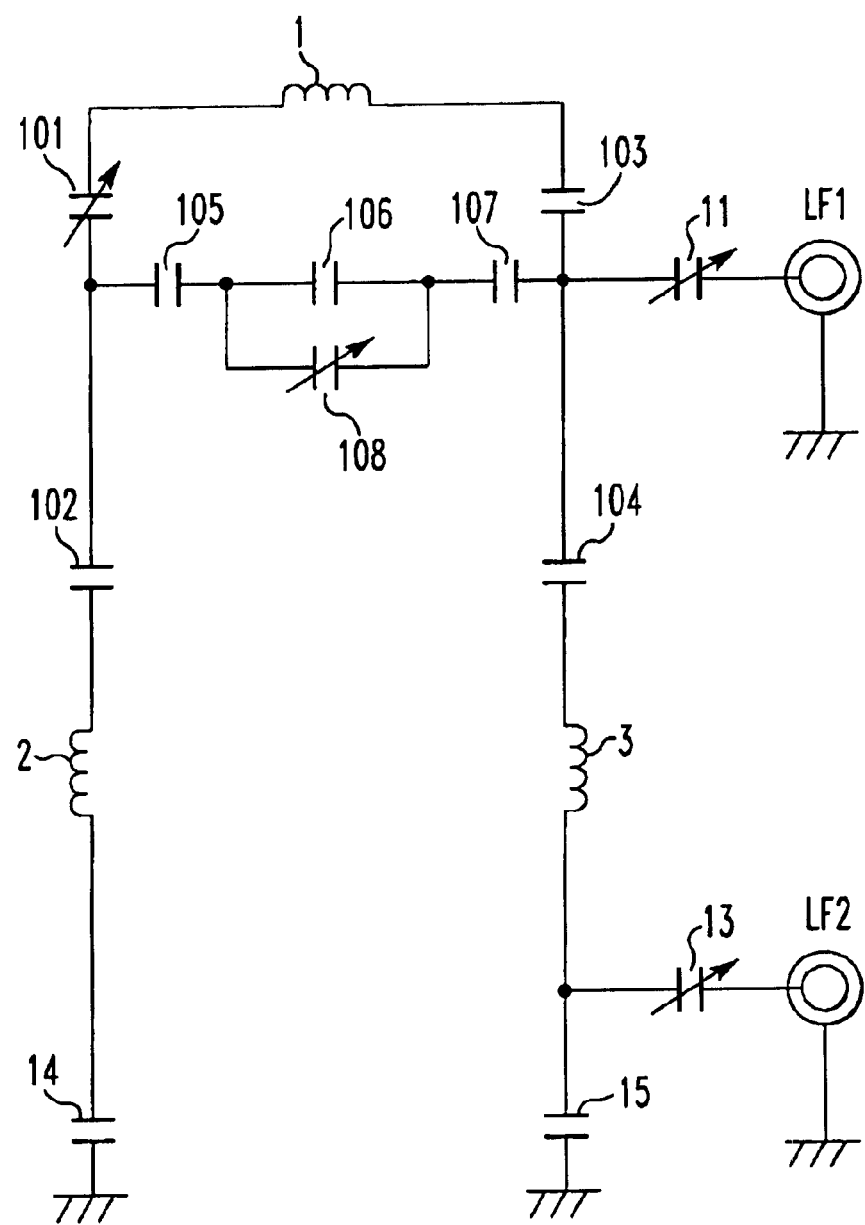
FIG. 10 is a diagram showing yet another embodiment of the multiple tuning circuit of the present invention.

Referring next to FIG. 10, there is shown a further embodiment of the multiple tuning circuit according to the present invention, the tuning circuit being for use in an NMR spectrometer. The tuning circuit is designed to irradiate two species of low-frequency resonating nuclei having resonant frequencies of LF1 and LF2, respectively, with RF signals simultaneously and to detect resulting NMR signals. The RF frequency LF1 is higher than LF2. For example, LF1 corresponds to the resonant frequency of $^{13}C$ nucleus, while LF2 corresponds to the resonant frequency of $^{17}O$ nucleus.

In FIG. 10, a sample coil 1 consists of a solenoid coil or saddle coil. An inductor 2 is indirectly connected with one end of the sample coil 1 via tuning capacitors 101 and 102 for LF2. Similarly, another inductor 3 is connected with the other end of the sample coil 1 via capacitors 103 and 104. The other ends of the inductors 2 and 3 are directly grounded or indirectly grounded via tuning capacitors 14 and 15, respectively, for LF2. In the illustrated embodiment, the two inductors are grounded indirectly.

The junction of the tuning variable capacitor 101 and capacitor 102 for LF2 is connected with the junction of the capacitors 103 and 104 indirectly via ground or directly by the capacitors 105, 106, 107, and a tuning variable capacitor 108 for LF1. In the illustrated embodiment, the two junctions are directly connected by plural capacitors.

Each of the inductors 2 and 3 may be a lumped inductor, such as a helical coil fabricated by winding wire like a coil, or may be a distributed inductor, such as a conducting rod. That is, each of the inductors 2 and 3 may be any inductive component element.

The tuning variable capacitor 101 for LF2 may be replaced by any one of the capacitors 102, 103, and 104. The capacitors 105, 106, 107, and tuning variable capacitor 108 for LF1 may be combined differently. In addition, the capacitors 105, 106, and 107 may be replaced by variable capacitors.

In this configuration, when the LC resonant circuit is resonating at the frequency LF2, an adjustment is so made that an area around the junction of the tuning variable capacitor 101 and capacitor 102 for LF2 is near zero potential. An area near the junction of the capacitors 103 and 104 is also near zero potential. As a result, the tuning variable capacitor 108 for LF1 does not affect the resonance at the frequency LF2. When the LC resonant circuit is resonating at the frequency LF1, if the capacitor 106 is set larger in capacitance than the capacitors 105 and 107, high voltage of LF1 is not applied to the tuning variable capacitor 108 for LF1.

While embodiments of the double tuning circuit have been described, embodiments of a triple tuning circuit are given below.

Figure 11:
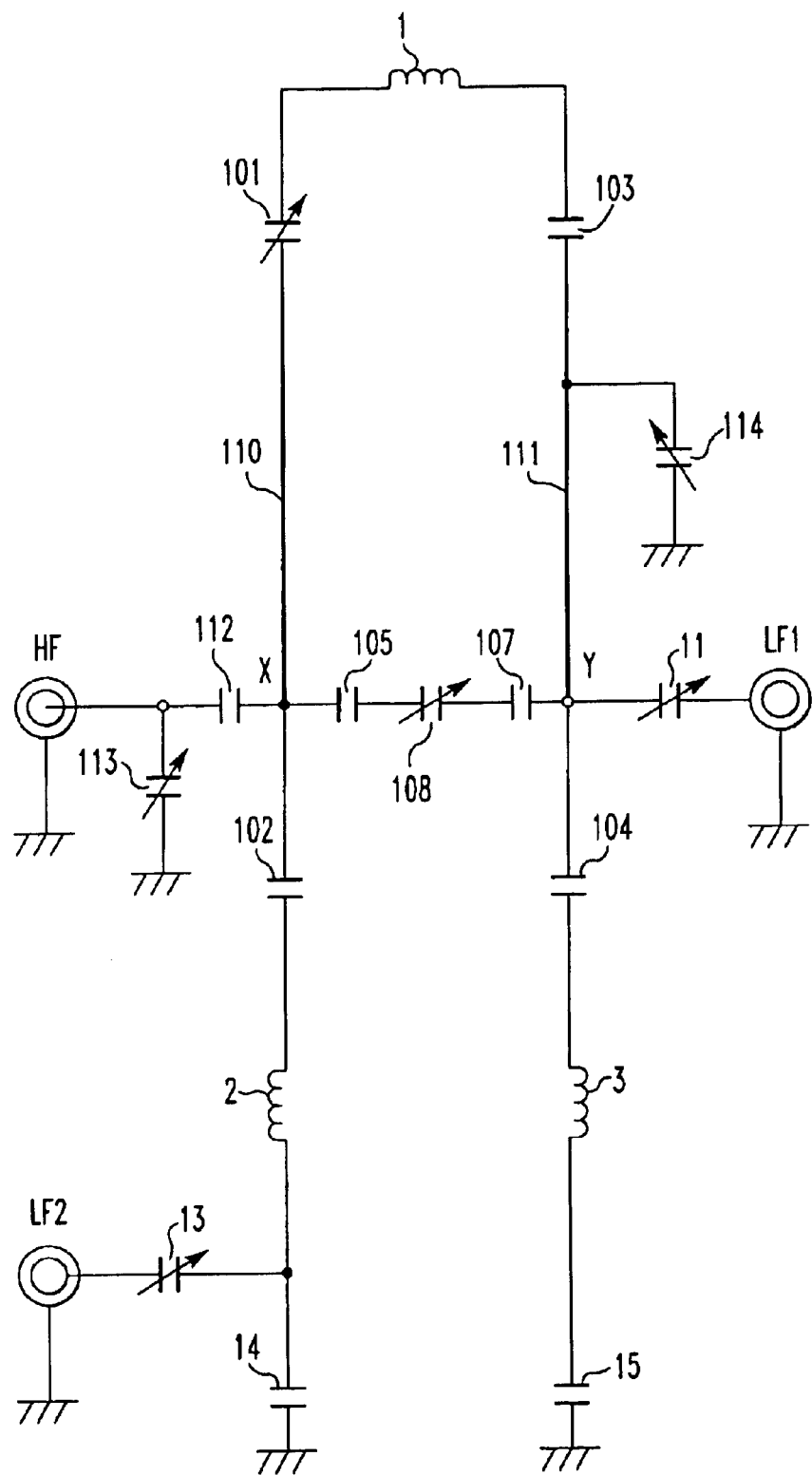
FIG. 11 is a diagram showing one embodiment of the triple tuning circuit of the present invention.

FIG. 11 shows an embodiment of the triple tuning circuit according to the present invention, the tuning circuit being for use in an NMR spectrometer. This multiple tuning circuit is so designed that it can irradiate one species of high-frequency resonating nuclei and two species of low-frequency resonating nuclei having resonant frequencies of HF, LF1, and LF2, respectively, with RF simultaneously and to detect resulting NMR signals. The frequency HF is higher than the frequencies LF1 and LF2 and corresponds to the resonant frequency of $^{1}H$ or $^{19}F$ nucleus. LF1 is a radio frequency higher than LF2. For instance, LF1 corresponds to the resonant frequency of $^{13}C$ nucleus. LF2 corresponds to the resonant frequency of $^{17}O$ nucleus.

In FIG. 11, a sample coil 1 consists of a solenoid coil or saddle coil. One end of the sample coil 1 is indirectly connected with one end of a conductor 110 via a tuning variable capacitor 101 for LF2. The other end of the sample coil 1 is indirectly connected with one end of a conductor 111 via a tuning capacitor 103 for LF2. The capacitors 101 and 103 for LF2 may be interchanged in position. Furthermore, the positions of the capacitors 101 and 103 for LF2 may be interchanged with the positions of the capacitors 102, 104.

One end of a tuning variable capacitor 114 for HF is connected with a location of the conductor 111 that is at a given distance from the side end of the conductor 111 that is closer to the sample coil. The other end of the variable capacitor 114 is grounded. This capacitor 114 may be mounted on the side of the conductor 110.

Figure 12:
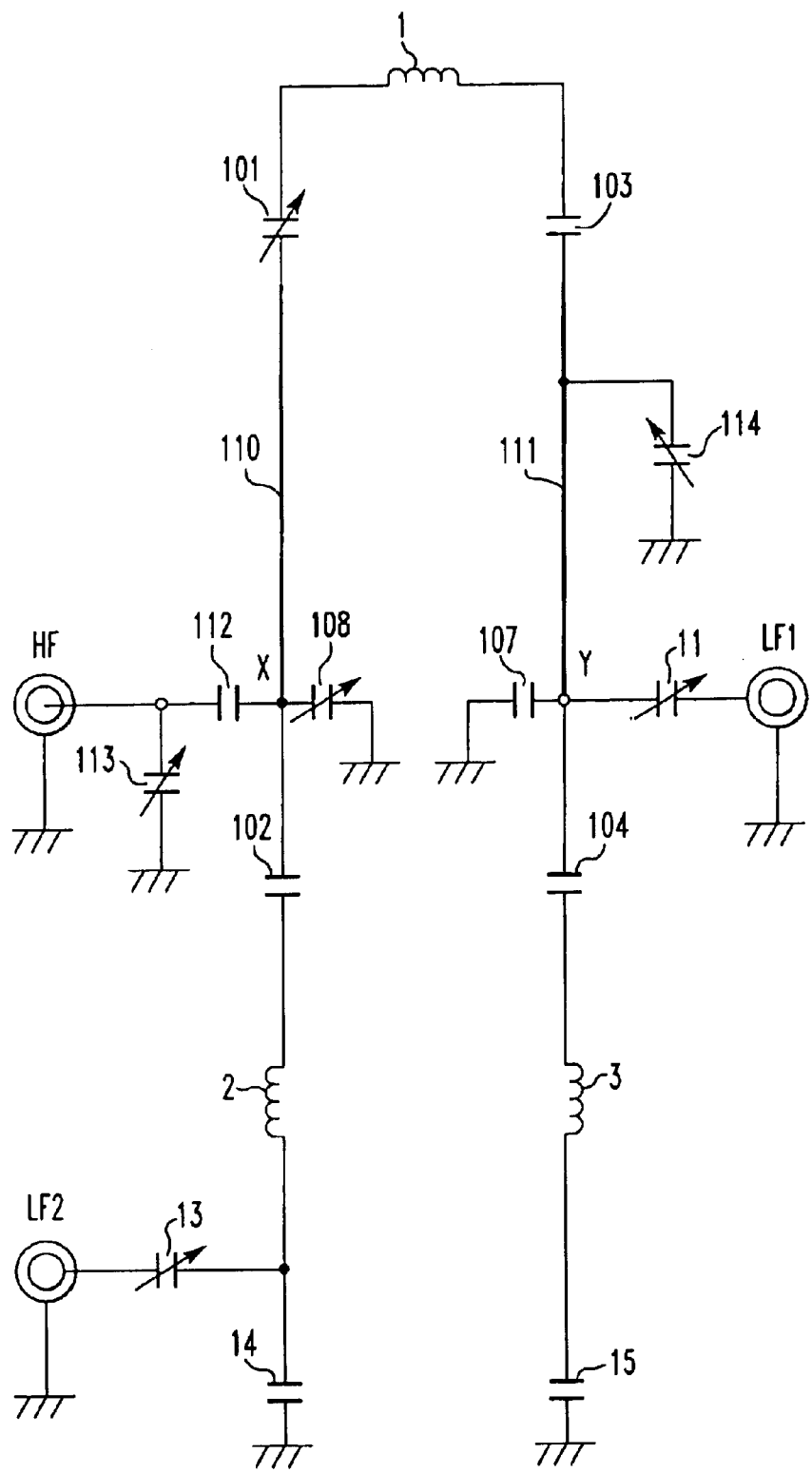
FIG. 12 is a diagram showing another embodiment of the triple tuning circuit of the present invention.

The two conductors 110 and 111 form parallel lines. One end X of the conductor 110 is connected with an input terminal for HF via an HF matching circuit consisting of an HF matching capacitor 112 and an HF matching variable capacitor 113. The other end Y of the conductor 111 is connected with an input terminal for LF1 via a matching variable capacitor 11 for LF1. The end X of the conductor 110 and the end Y of the conductor 111 are connected by a tuning capacitor 105, a tuning variable capacitor 108, and a tuning capacitor 107 for the resonant frequency LF1. The end X of the conductor 110 and the end Y of the conductor 111 may also be connected indirectly via ground by a capacitive element for LF1 tuning as shown in FIG. 12. The HF matching circuit and the matching variable capacitor 11 for LF1 may be interchanged in position.

The end X of the conductor 110 is connected with one end of the inductor 2 via the capacitor 102. The other end of the inductor 2 is indirectly grounded via the capacitor 14 or directly grounded without via the capacitor 14. FIG. 11 shows an embodiment in which the other end of the inductor is grounded via the capacitor 14. The end Y of the conductor 111 is connected with one end of the inductor 3 via the capacitor 104. The other end of the inductor 3 is indirectly grounded via the capacitor 15 or directly grounded without via the capacitor 15. FIG. 11 shows an embodiment in which the other end of the inductor is grounded via the capacitor 15. An input terminal for LF2 is connected with the junction of the inductor 2 and capacitor 14 via a matching variable capacitor 13 for LF2. The variable capacitor 13 for LF2 and the input terminal for LF2 may be mounted on the side of the junction of the inductor 3 and capacitor 15.

Under this state, the sample coil 1, tuning variable capacitor 101 for LF2, tuning capacitor 103, conductors 110, 111, tuning capacitors 102, 104, inductors 2, 3, and tuning capacitors 14, 15 together form a balanced resonant circuit where the amplitude voltage becomes zero near the center point of the sample coil 1. Each of the inductors 2 and 3 may be a lumped inductor, such as a helical coil fabricated by winding wire like a coil, or may be a distributed inductor, such as a conducting rod. That is, each of the inductors 2 and 3 may be any inductive component element. Similarly, each of the conductors 110 and 111 may be a lumped inductor, such as a helical coil fabricated by winding wire like a coil, or may be a distributed inductor, such as a conducting rod. That is, each of the inductors 110 and 111 may be any inductive component element.

Figure 13:
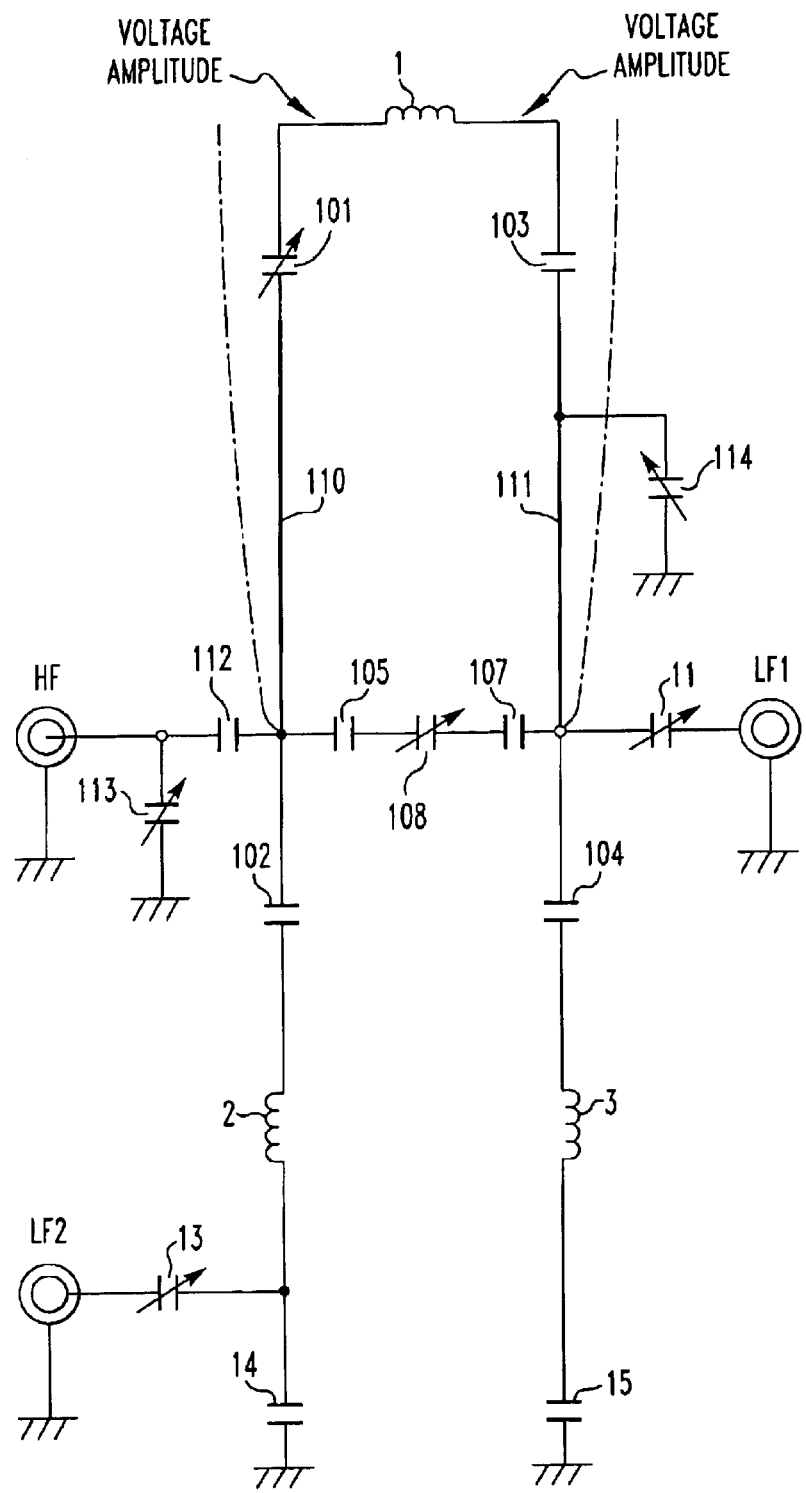
FIG. 13 is a diagram similar to FIG. 11, but showing one example of resonant state.

The operation of this triple tuning circuit is next described. FIG. 13 shows the amplitude voltage of RF waves having a frequency of HF at some instant of time when the circuit is resonating at HF. The tuning variable capacitor 101 for LF2, tuning capacitors 103, 105, 107, and tuning variable capacitor 108 for LF1 show sufficiently small impedances at the frequency HF and so they can be regarded to be shorted. As a result, the conductors 110, 111, tuning variable capacitor 101 for LF2, and capacitor 103 together form a quarter-wavelength, two-wire line resonator. RF voltages which are identical in voltage amplitude but opposite in sign are produced at the opposite ends of the sample coil 1. As a result, an HF resonance occurs. When viewed from the sample coil 1, this HF resonance is a balanced resonance in which two RF voltages are identical in voltage amplitude but opposite in sign. Therefore, for the same amount of RF power, the produced RF voltage is half compared with an unbalanced resonant circuit. As a result, the circuit of the present embodiment can withstand four times the maximum tolerable electric power of a normal unbalanced circuit.

Figure 14:
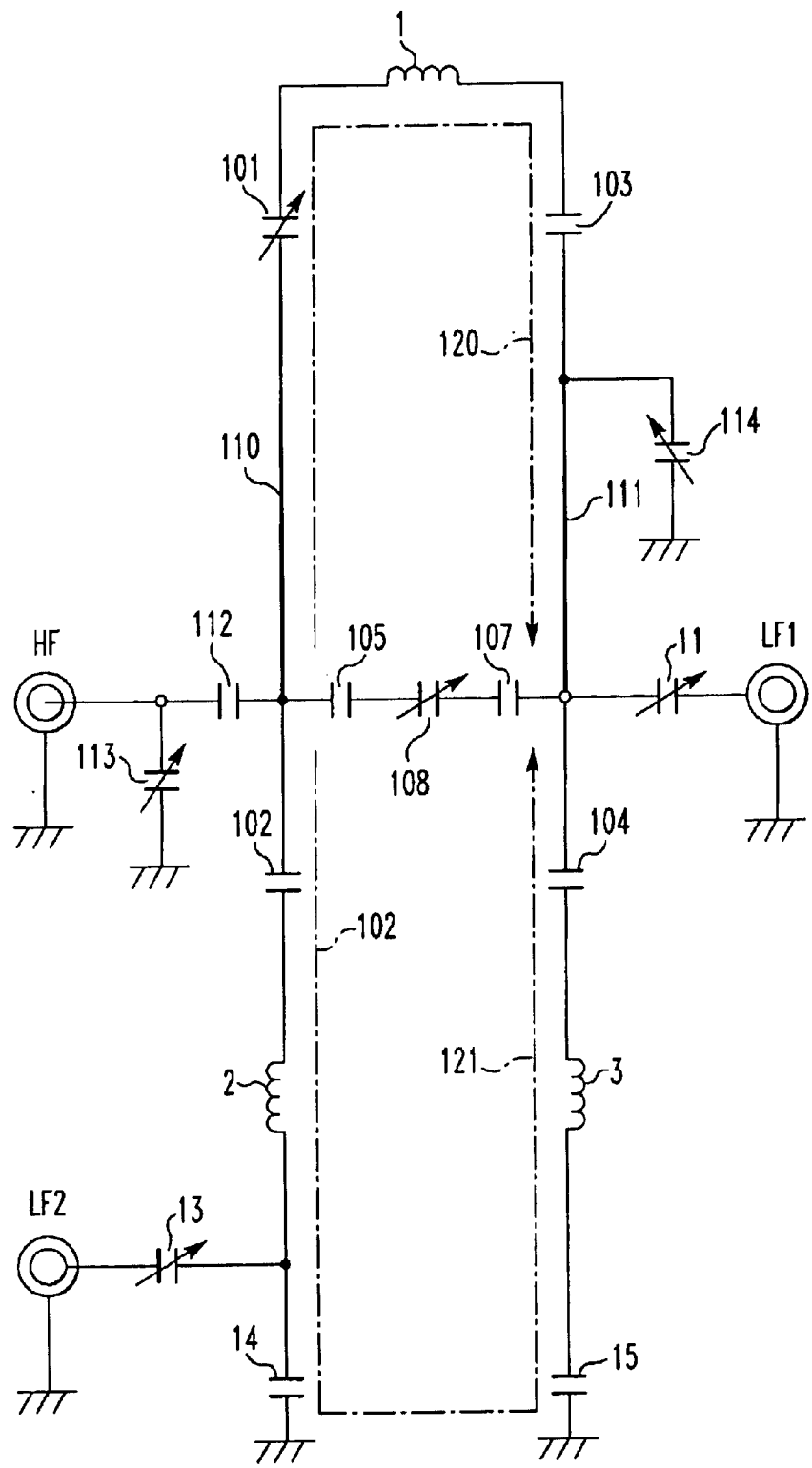
FIG. 14 is a diagram similar to FIG. 11, but showing another example of resonant state.

FIG. 14 shows the triple tuning circuit when resonating at LF1. Because the tuning variable capacitor 101 for LF2, and capacitors 14, 15, 102, 103, and 104 have large capacitances and show sufficiently small impedances at the frequency LF1, they are almost shorted. The conductors 110 and 111 have small inductances. Therefore, as for inductive elements, their contribution is small. In consequence, approximately speaking, the two inductors 2 and 3 are connected in series, and the series combination of these inductors 2, 3 and sample coil 1 are connected in parallel.

The series combination of the inductors 2 and 3 and the sample coil 1 are connected in parallel to thereby form a resultant inductance. This resultant inductance, tuning capacitors 105, 107 for LF1, and tuning variable capacitor 108 for LF1 together form a resonant circuit. The resonant circuit is tuned and matched to the frequency LF1 by the tuning variable capacitor 108 and matching variable capacitor 11. Since the frequencies HF and LF1 are spaced apart, the LF1 resonance is affected only a little by the HF matching circuit. Furthermore, the LF2 resonance circuit affects the LF1 resonance only a little, because the LF2 matching circuit is placed in a position where the amplitude voltage of LF1 also gives zero potential. At some instant of time, tuning and matching are made at the resonant frequency LF1, and the resonant current maximizes. One example of the orientation of RF current under this condition is indicated by the arrows 120 and 121. The arrow 120 indicates the orientation of an RF current flowing through the sample coil 1. The arrow 121 indicates the orientation of an RF current flowing through the inductors 2 and 3 connected in series. Both RF currents are parallel to each other in exactly the same way as the orientations of the currents 21 and 22 shown in FIG. 5.

Figure 15:
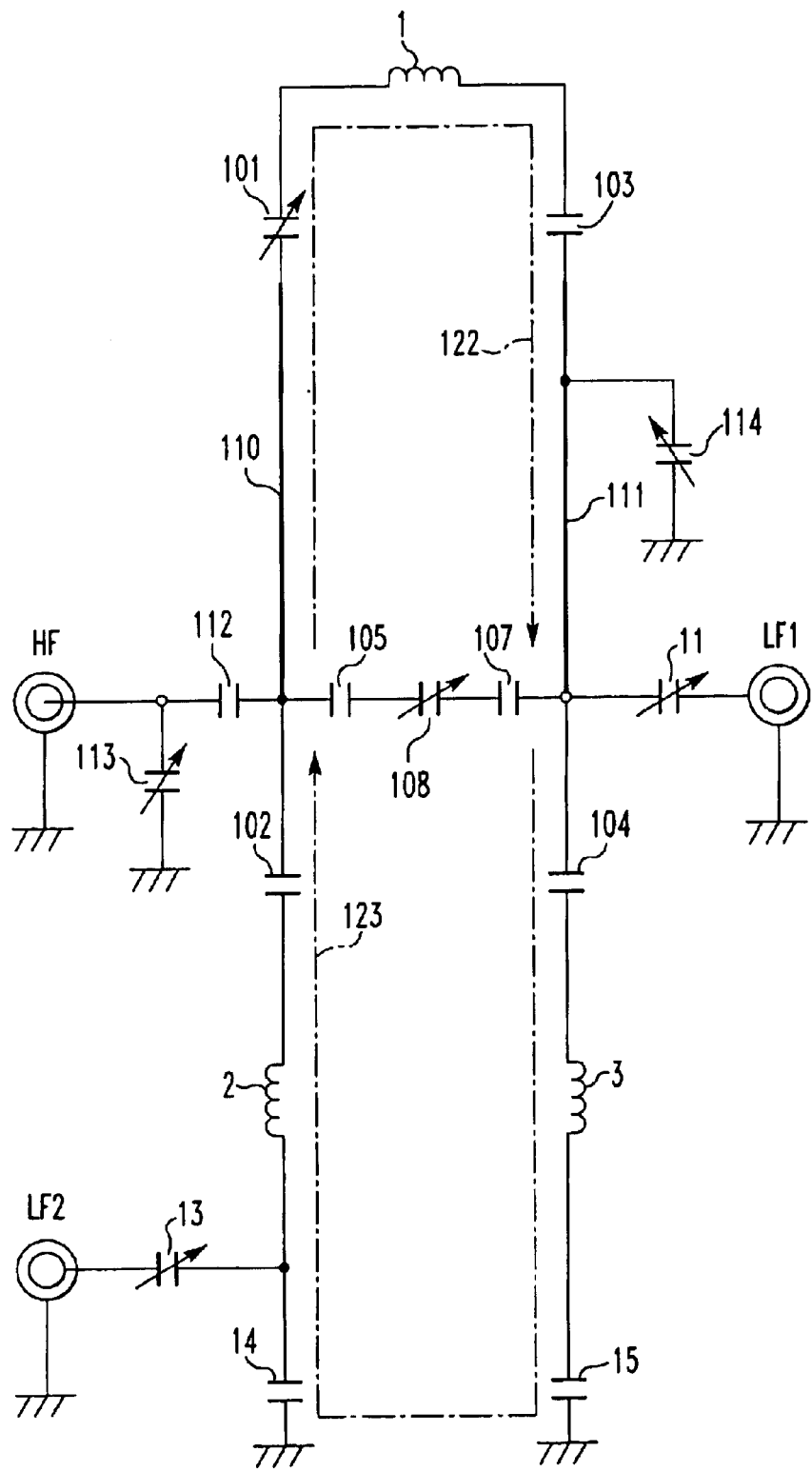
FIG. 15 is a diagram similar to FIG. 11, but showing a further example of resonant state.

FIG. 15 shows the triple tuning circuit when resonating with an RF current having a frequency of LF2. Two tuning capacitors 105, 107 for LF1, tuning variable capacitor 108 for LF1, HF matching circuit, and LF1 matching circuit are placed in such positions that the amplitude voltage of the frequency LF2 gives almost zero potential. Therefore, the LF2 resonance is affected only a little. The capacitors 14 and 15 have large capacitances and show sufficiently small impedances at the frequency LF2. Therefore, the inductors 2 and 3 can be regarded to be connected in series. Furthermore, the conductors 110 and 111 have small inductance values and, therefore, as for inductive elements, their contribution is small. As a result, approximately speaking, the sample coil 1 and the two inductors 2, 3 are connected in series.

Consequently, the series combination of the sample coil 1 and two inductors 2, 3 produces a resultant inductance. This resultant inductance, the tuning variable capacitor 101 for LF2, and three capacitors 102, 103, 104 for LF2 together form a resonant circuit. The resonant circuit is tuned and matched to LF2 by the tuning variable capacitor 101 and matching variable capacitor 13 on the side of LF2. Since the resultant inductance of the series combination of the sample coil 1 and inductors 2, 3 is high, it is adapted to cause resonance at LF2 that is lower than LF1. At some instant of time, tuning and matching are made at the resonant frequency LF2, and the resonant current maximizes. Examples of the orientation of an RF current under this condition are indicated by the arrows 122 and 123. The arrow 122 indicates an RF current flowing through the sample coil 1. The arrow 123 indicates an RF current flowing through the inductors 2 and 3 connected in series Both are in parallel to each other.

This is exactly the same as the flow of currents 61 and 61 shown in FIG. 6. Accordingly, the RF voltage produced across the inductor 2, the RF voltage developed across the sample coil 1, and the RF voltage generated across the inductor 3 are not summed up in exactly the same way as in the case of FIG. 6.

Figure 16:
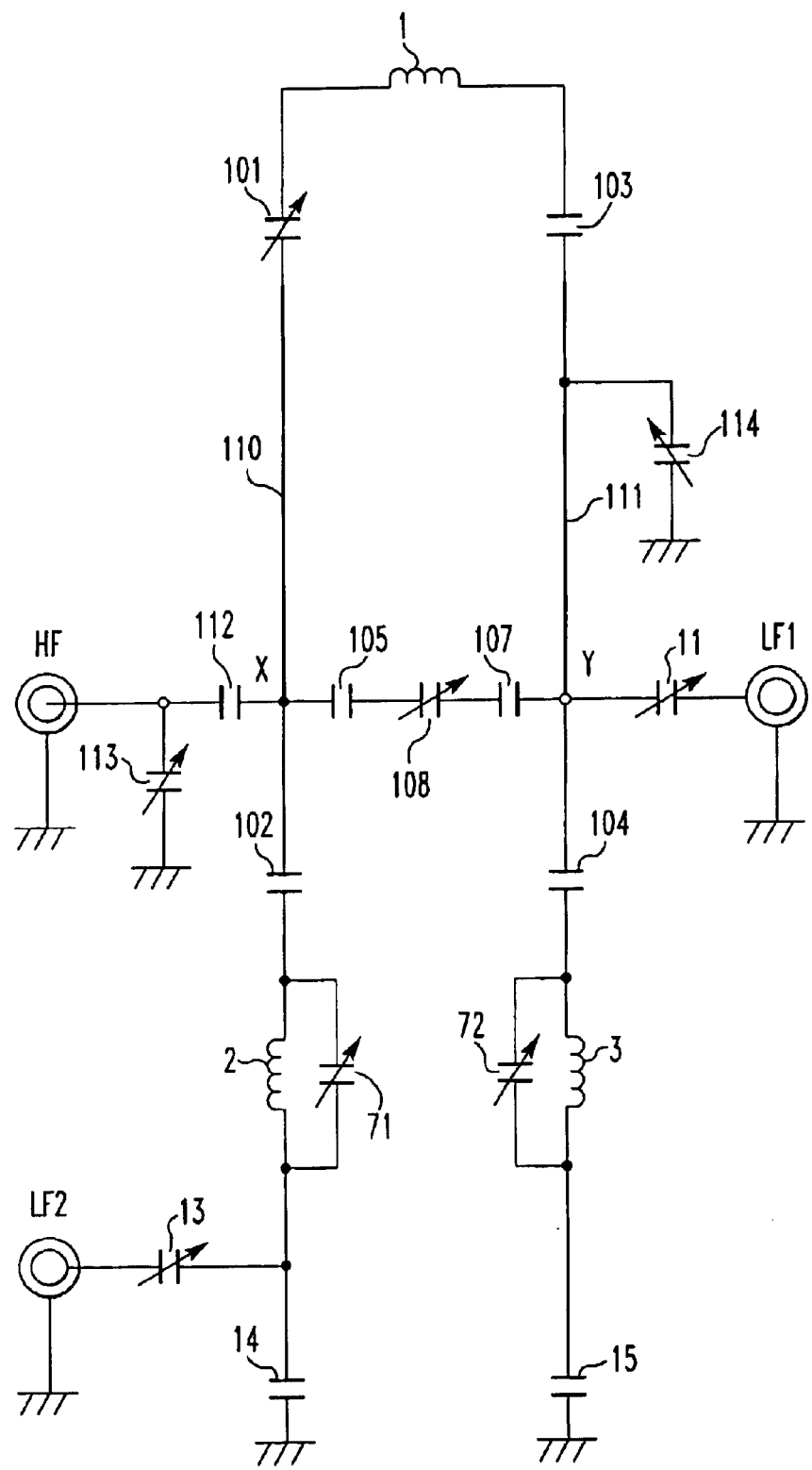
FIG. 16 is a diagram showing another triple tuning circuit according to the present invention, the circuit being for use in an NMR spectrometer.

FIG. 16 shows another embodiment of the triple tuning circuit according to the present invention, the tuning circuit being for use in an NMR spectrometer. This multiple tuning circuit is so designed that it can irradiate one species of high-frequency resonating nuclei and two species of low-frequency resonating nuclei having resonating frequencies of HF, LF1, and LF2, respectively, simultaneously and to detect resulting NMR signals. The frequency HF is higher than the frequencies LF1 and LF2 and corresponds to the resonant frequency of $^1$H or $^{19}$F nucleus. LF1 is a radio frequency higher than LF2. For instance, LF1 corresponds to the resonant frequency of $^{13}$C nucleus. LF2 corresponds to the resonant frequency of $^{17}$O nucleus.

In FIG. 16, a sample coil 1 consists of a solenoid coil or saddle coil. One end of the sample coil 1 is indirectly connected with one end of a conductor 110 via a tuning variable capacitor 101 for LF2. The other end of the sample coil 1 is indirectly connected with one end of a conductor 111 via a tuning capacitor 103 for LF2. The capacitors 101 and 103 for LF2 may be interchanged in position. Furthermore, the positions of the capacitors 101 and 103 for LF2 may be interchanged with the positions of the capacitors 102, 104.

One end of a tuning variable capacitor 114 for HF is connected with a location of the conductor 111 that is at a given distance from the side end of the conductor 111 that is closer to the sample coil. The other end of the variable capacitor 114 is grounded. This capacitor 114 may also be mounted on the side of the conductor 110.

The two conductors 110 and 111 form two-wire lines. One end X of the conductor 110 is connected with an input terminal for HF via an HF matching circuit consisting of an HF matching capacitor 112 and an HF matching variable capacitor 113. The other end Y of the conductor 111 is connected with an input terminal for LF1 via a matching variable capacitor 11 for LF1. The end X of the conductor 110 and the end Y of the conductor 111 are connected by a tuning capacitor 105, a tuning variable capacitor 108, and a tuning capacitor 107 for the resonant frequency LF1. The HF matching circuit and the matching variable capacitor 11 for LF1 may be interchanged in position.

The end X of the conductor 110 is connected with one end of the inductor 2 via the capacitor 102. The other end of the inductor 2 is indirectly grounded via the capacitor 14 or directly grounded without via the capacitor 14. FIG. 16 shows an embodiment in which the other end of the inductor is grounded via the capacitor 14. The end Y of the conductor 111 is connected with one end of the inductor 3 via the capacitor 104. The other end of the inductor 3 is indirectly grounded via the capacitor 15 or directly grounded without via the capacitor 15. FIG. 16 shows an embodiment in which the other end of the inductor is grounded via the capacitor 15. An input terminal for LF2 is connected with the junction of the inductor 2 and capacitor 14 via a matching variable capacitor 13 for LF2. The variable capacitor 13 and the input terminal for LF2 may be mounted on the side of the junction of the inductor 3 and capacitor 15.

Under this state, the sample coil 1, tuning variable capacitor 101 for LF2, tuning capacitor 103, conductors 110, 111, tuning capacitor 102, 104, inductors 2, 3, and tuning capacitors 14, 15 together form a balanced resonant circuit where the amplitude voltage becomes zero near the center point of the sample coil 1.

Each of the inductors 2 and 3 may be a lumped inductor, such as a helical coil fabricated by winding wire like a coil, or may be a distributed inductor, such as a conducting rod. That is, each of the inductors 2 and 3 may be any inductive component element. Similarly, each of the inductors 110 and 111 may be a lumped inductor, such as a helical coil fabricated by winding wire like a coil, or may be a distributed inductor, such as a conducting rod. That is, each of the inductors 110 and 111 may be any inductive component element.

In this embodiment, variable capacitive elements 71 and 72 are connected in parallel with the inductors 2 and 3, respectively. A parallel resonant circuit for LF1 is formed by appropriately setting the values of the variable capacitive elements 71 and 72. Transmission of RF power of LF1 to the tuning and matching circuit side for LF2 is prevented. Consequently, when tuning and matching are made at LF2, if the capacitances of the variable capacitors 12 and 13 are varied, the circuit side of LF1 is hardly affected. The variable capacitive elements 71 and 72 may also be fixed capacitive elements.

Figure 17:
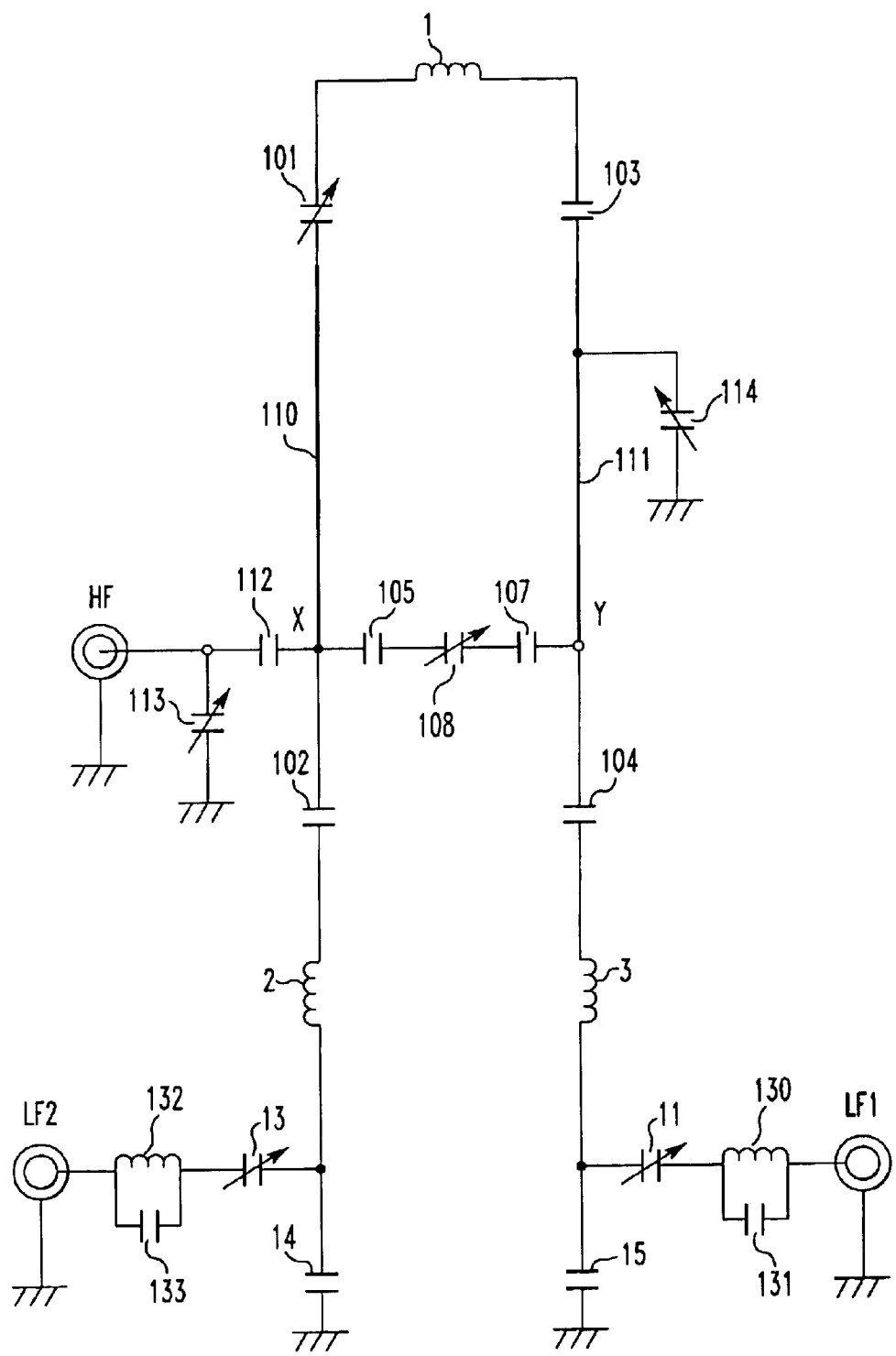
FIG. 17 is a diagram showing a further triple tuning circuit according to the present invention, the circuit being for use in an NMR spectrometer.

FIG. 17 shows a further embodiment of the triple tuning circuit according to the present invention, the tuning circuit being for use in an NMR spectrometer. This multiple tuning circuit is so designed that it can irradiate one species of high-frequency resonating nuclei and two species of low-frequency resonating nuclei having resonating frequencies of HF, LF1, and LF2, respectively, simultaneously and to detect resulting NMR signals. The frequency HF is higher than the frequencies LF1 and LF2 and corresponds to the resonant frequency of $^{1}H$ or $^{19}F$ nucleus. LF1 is a radio frequency higher than LF2. For instance, LF1 corresponds to the resonant frequency of $^{13}C$ nucleus. LF2 corresponds to the resonant frequency of $^{17}O$ nucleus.

In FIG. 17, a sample coil 1 consists of a solenoid coil or saddle coil. One end of the sample coil 1 is indirectly connected with one end of a conductor 110 via a tuning variable capacitor 101 for LF2. The other end of the sample coil 1 is indirectly connected with one end of a conductor 111 via a tuning capacitor 103 for LF2. The tuning capacitors 101 and 103 for LF2 may be interchanged in position. Furthermore, the positions of the capacitors 101 and 103 for LF2 may be interchanged with the positions of the capacitors 102, 104.

One end of a tuning variable capacitor 114 for HF is connected with a location of the conductor 111 that is at a given distance from the side end of the conductor 111 that is closer to the sample coil. The other end of the variable capacitor 114 is grounded. This capacitor 114 may also be mounted on the side of the conductor 110.

The two conductors 110 and 111 form two-wire lines. One end X of the conductor 110 is connected with an input terminal for HF via an HF matching circuit consisting of a matching capacitor 112 for HF and a matching variable capacitor 113 for HF. The end X of the conductor 110 and an end Y of the conductor 111 are connected by a tuning capacitor 105, a tuning variable capacitor 108, and a tuning capacitor 107 for the resonant frequency LF1. The HF matching circuit may be placed either on the side of the end X or on the side of the end Y.

The end X of the conductor 110 is connected with one end of the inductor 2 via the capacitor 102. The other end of the inductor 2 is indirectly grounded via the capacitor 14 or directly grounded without via the capacitor 14. FIG. 17 shows an embodiment in which the other end of the inductor is grounded via the capacitor 14. The end Y of the conductor 111 is connected with one end of the inductor 3 via the capacitor 104. The other end of the inductor 3 is indirectly grounded via the capacitor 15 or directly grounded without via the capacitor 15. FIG. 17 shows an embodiment in which the other end of the inductor is grounded via the capacitor 15. An input terminal for LF2 is connected with the junction of the inductor 2 and capacitor 14 via a matching variable capacitor 13 for LF2. The variable capacitor 13 for LF2 and the input terminal for LF2 may be mounted on the side of the junction of the inductor 3 and capacitor 15. An input terminal for LF1 is connected with the junction of the inductor 3 and the capacitor 15 via the matching variable capacitor 11 for LF1. The matching variable capacitor 11 for LF1 and the input terminal for LF1 may also be mounted on the side of the junction of the inductor 2 and the capacitor 14.

In the embodiment of FIG. 17, the HF matching circuit is mounted at the end X of the conductor 110. The circuit may also be mounted at the end Y of the conductor 111. Furthermore, the circuit may be mounted at the junction of the inductor 2 and the capacitor 14, i.e., at the same location as the matching circuit for LF2. Alternatively, the circuit may be mounted at the junction of the inductor 3 and capacitor 15, i.e., at the same location as the matching circuit for LF1, for the following reason. Since the HF resonance circuit has a high Q value, HF RF power can be injected into the HF resonant circuit even if the HF matching circuit is somewhat remote from the HF resonant circuit.

Under this state, the sample coil 1, tuning variable capacitor 101 for LF2, tuning capacitor 103, conductors 110, 111, tuning capacitors 102, 104, inductors 2, 3, and tuning capacitors 14, 15 together form a balanced resonant circuit where the amplitude voltage becomes zero near the center point of the sample coil 1. Each of the inductors 2 and 3 may be a lumped inductor, such as a helical coil fabricated by winding wire like a coil, or may be a distributed inductor, such as a conducting rod. That is, each of the inductors 2 and 3 may be any inductive component element. Similarly, each of the inductors 110 and 111 may be a lumped inductor such as a helical coil fabricated by winding wire like a coil or may be a distributed inductor such as a conducting rod. That is, each of the inductors 110 and 111 may be any inductive component element.

In this embodiment, a band-reject filter for rejecting LF2 is inserted between the input terminal for LF1 and the matching variable capacitor 11 for LF1. The band-reject filter consists of a coil 130 and a capacitor 131 parallel-resonating at LF2. Another band-reject filter for rejecting LF1 is inserted between the input terminal for LF2 and the matching variable capacitor 13 for LF2, the filter consisting of a coil 132 and a capacitor 133 parallel-resonating at LF1. This can suppress both transmission of frequency LF1 to the input terminal for LF2 and transmission of frequency LF2 to the input terminal for LF1. Hence, the transmitter can be protected against strong RF power.

Figure 18A:
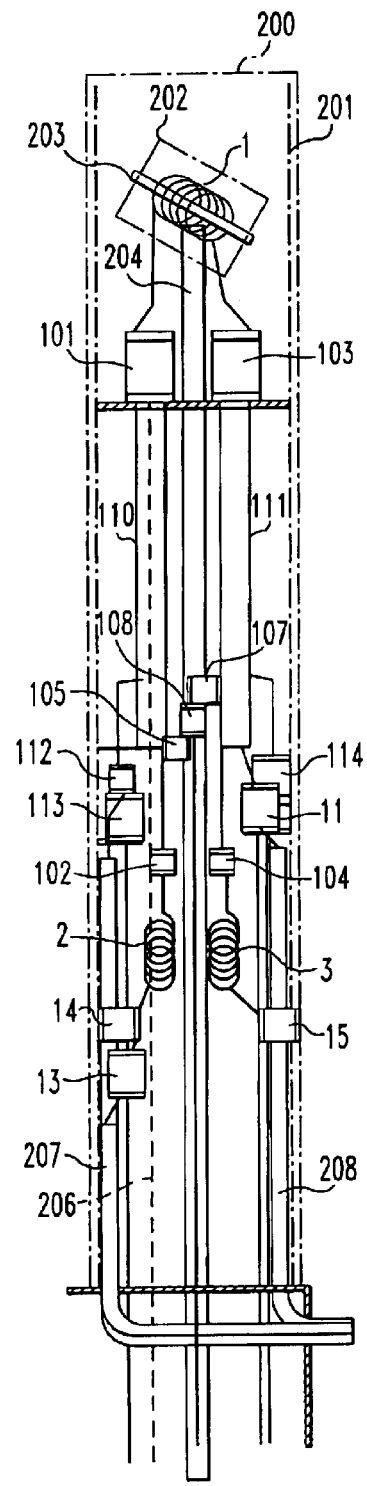
FIGS. 18(*a*), 18(*b*), and 18(*c*) show one embodiment of the NMR probe according to the present invention.
Figure 18B:
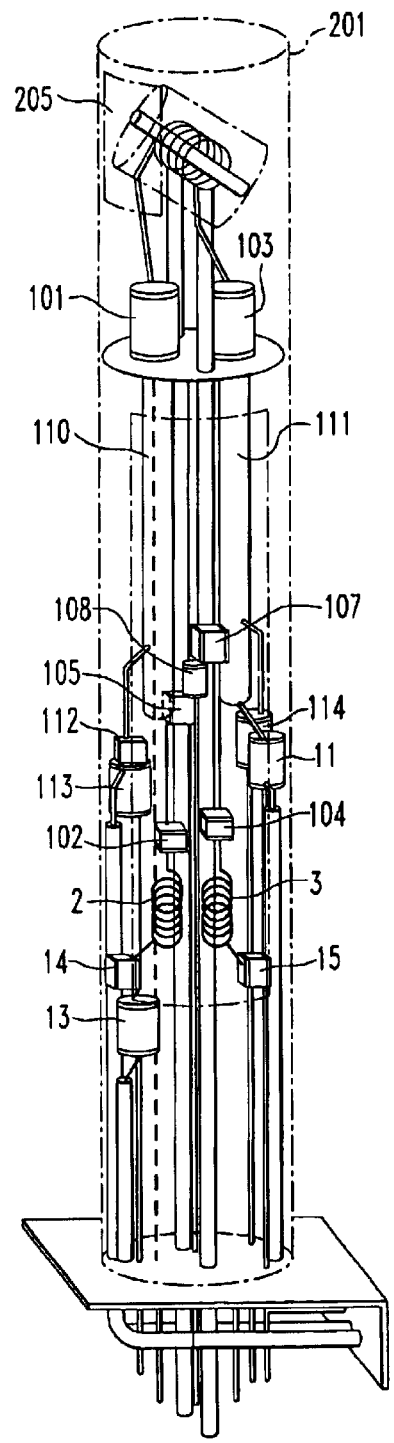
Figure 18C:
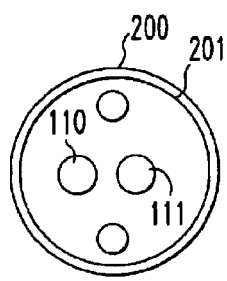

FIGS. 18(a), 18(b), and 18(c) show the arrangement of electronic components where a multiple tuning circuit according to the present invention is mounted in an NMR probe. FIG. 18(a) is a vertical cross section of the probe. FIG. 18(b) shows the state in which the cover has been removed from the probe. FIG. 18(c) is a horizontal cross section of the probe. This embodiment assumes that the NMR probe is used only for solid samples. The probe rotates a sample tube at a high speed while the tube is tilted at a given angle to the external magnetic field.

In FIGS. 18(a), 18(b), and 18(c), a hollow, cylindrical electrode 201 is mounted inside the probe cover 200. A sample-rotating mechanism 202 tilted at a given angle to the external field is mounted inside a top portion of the cylindrical electrode 201. A sample coil 1 is placed inside the sample-rotating mechanism 202. A sample tube 203 in which a solid sample is sealed is placed in the sample coil 1. An air tube 204 is connected with the sample-rotating mechanism 202 to rotate the sample tube 203 at a high speed. A pressurized air jet is appropriately blown against the sample tube 203 to drive it. The top portion of the cylindrical electrode 201 is provided with a window 205 to place the inside of the probe in communication with the outside. This permits the sample tube 203 to be taken in and out of the sample-rotating mechanism 202.

A tuning variable capacitor 101 for LF2 and a tuning capacitor 103 for LF2 are connected with the opposite ends of the sample coil 1. The capacitance of the variable capacitor 101 can be varied by a shaft 206. As a whole, a quarter-wavelength resonator is built by making use of conductors 110 and 111 as internal conductors and using the cylindrical electrode 201 as an external conductor, besides the tuning variable capacitor 101 for LF2 and the tuning capacitor 103 for LF2. Furthermore, by utilizing the cylindrical electrode 201 as a common grounding electrode, various components (i.e., tuning capacitors 105, 107 for LF1, tuning variable capacitor 114 for LF1, matching capacitor 112 for HF, matching variable capacitor 113 for HF, tuning variable capacitor 114 for HF, matching variable capacitor 11 for LF1, tuning variable capacitors 102, 104 for LF2, inductors 2, 3, capacitors 14, 15, variable capacitor 13 for LF2, and coaxial cables 207, 208) are compactly mounted inside the cylindrical electrode 201.

In this embodiment, using the hollow cylindrical electrode 201 as a grounding electrode dispenses with the conventional grounding electrode that is a frame consisting of a pillar and a disk. Consequently, the space for accommodating electronic components can be made wider. This permits heavy-duty capacitive elements having large outside diameters to be mounted on the tuning variable capacitor 101 for LF2 and on the tuning capacitor 103 for LF2. At LF2 resonance, the multiple tuning circuit can show an improved voltage resistance compared with the conventional circuit. In addition, the cylindrical electrode 201 is used as a grounding electrode, and the ground impedance is made smaller than conventional. In consequence, RF power loss can be reduced. Moreover, HF waves of higher resonant frequency than conventional can be obtained. Moreover, the Q value of the resonator itself is enhanced, because the large-sized cylindrical electrode 201 is adopted.

With respect to the large-sized capacitive elements 101 and 103, the interelectrode distance is large. Therefore, it is necessary to adjust the conductors 110 and 111 to shorter than the quarter wavelength. Therefore, the conductors 110 and 111 are not required to be set equal to the quarter wavelength. It is only required that the whole structure operate as a quarter-wavelength resonator including the capacitive elements 101 and 103 for connecting a respective one end of the conductors 110 and 111 with the sample coil 1 and LF2 tuning capacitors 102 and 104 for connecting the other ends of the conductors 110 and 111 with the inductors 2 and 3, respectively.

It is to be noted that the shape of the cylindrical electrode 201 is not always limited to a cylindrical form. Furthermore, the cylindrical electrode 201 does not need to cover the whole probe. It suffices to cover only the electrical circuit portion of the multiple tuning circuit.

While an NMR probe incorporating the multiple tuning circuit shown in FIG. 11 has been described as a typical embodiment, it is obvious that the mounting method using the cylindrical electrode 201 as external and grounding electrodes can be similarly applied to other embodiments shown in FIGS. 4–17.

This mounting method can also be applied to a balanced resonating probe having no inductive elements other than a sample coil, e.g., an MQMAS (multi-quantum magic-angle spinning) probe where the RF amplitude voltage in a resonant circuit becomes null near the center point of the sample coil.

Figure 19:
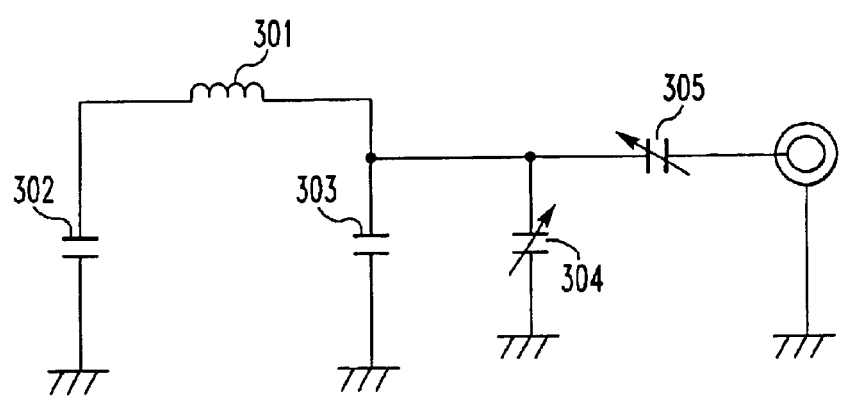
FIG. 19 is an electrical circuit diagram of an MQMAS probe.

FIG. 19 shows one embodiment of the electrical circuit of the MQMAS probe. This circuit includes a sample coil 301 which forms an LC resonator together with a first capacitor 302, a second capacitor 303, a tuning variable capacitor 304, and a matching variable capacitor 305. This resonator performs a balanced operation such that RF amplitude voltage becomes null near the center point of the sample coil 301. The present circuit enables tuning and matching by means of the tuning variable capacitor 304 and the matching variable capacitor 305.

FIGS. 20(a), 20(b), and 20(c) show one embodiment of the method of implementing the mounting method of the present invention in an MQMAS probe. FIG. 20(a) is a vertical cross section of the probe. FIG. 20(b) shows the state in which the probe cover has been removed. FIG. 20(c) is a vertical cross section taken near variable capacitors 304 and 305.

In FIGS. 20(a), 20(b), and 20(c), a cylindrical electrode 341 is mounted inside the probe cover, 314, and used as a common grounding electrode of the electrical circuitry. A sample-rotating mechanism 306 tilted at a given angle to an external magnetic field is mounted inside the top portion of the cylindrical electrode 341. A sample coil 301 is placed inside the sample-rotating mechanism 306. A sample tube 315 in which a solid sample is sealed is placed in the sample coil 301. An air tube 307 is connected with the sample-rotating mechanism 306 to rotate the sample tube 315 at a high speed. A pressurized air jet is appropriately blown against the sample tube 315 to drive it. The top portion of the cylindrical electrode 341 is provided with a window 342 to place the inside of the probe in communication with the outside. This permits the sample tube 315 to be taken in and out of the sample-rotating mechanism 306.

Tuning variable capacitors 302 and 303 are connected with the opposite ends of the sample coil 301. The electrode on one side of each of the tuning capacitors 302 and 303 is directly soldered to the inner wall of the cylindrical electrode 341, whereby the electrode is grounded. Besides these tuning capacitors 302 and 303, tuning variable capacitors 304 and 305 are provided. The capacitances of these variable capacitors can be varied by shafts 312. A coaxial cable 311 connects an external spectrometer with the electrical circuit of the MQMAS probe.

In this embodiment, since the hollow cylindrical electrode 341 is used as a grounding electrode, the conventional grounding electrode that is a frame consisting of a pillar and a disk is dispensed with. Therefore, the space for accommodating the tuning variable capacitor 304 and matching variable capacitor 305 can be made wider. This permits use of heavy-duty capacitive elements having large outside diameters. Consequently, the voltage resistance of the RF circuit can be improved. The cylindrical electrode 341 is used as a grounding electrode and so RF ground current flows through a wide area of the cylindrical electrode 341. Since the ground impedance is small, the RF power loss can be made small.

Figure 21A:
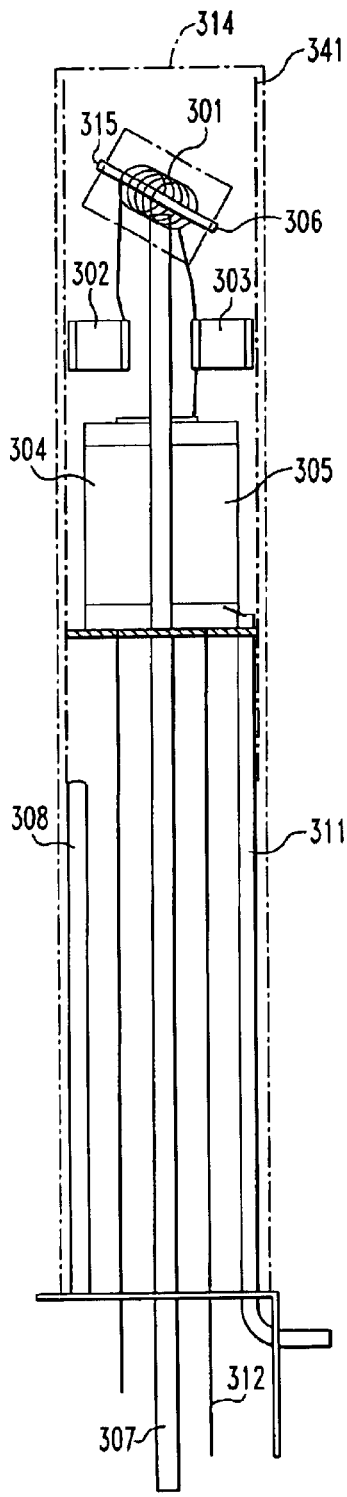
FIGS. 21(a), 21(b), and 21(c) show another embodiment of the MQMAS probe according to the present invention.
Figure 21B:
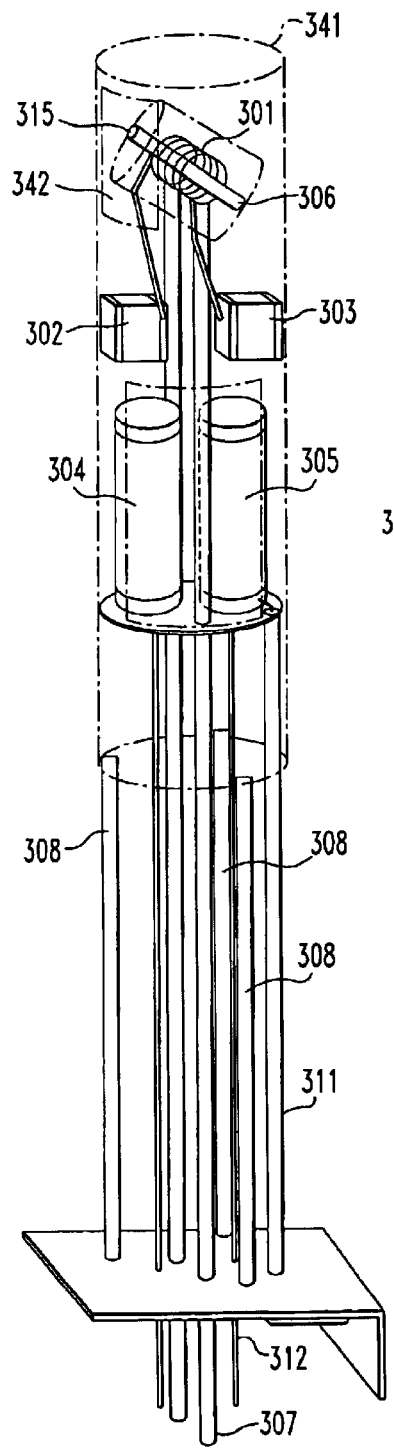
Figure 21C:
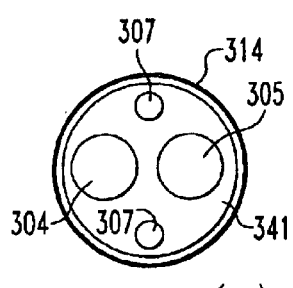

It is to be noted that the shape of the cylindrical electrode 341 is not limited to a cylindrical form. Furthermore, the cylindrical electrode 341 is not always required to cover the whole MQMAS probe. It suffices to cover only the electrical circuit portion of the RF circuit as shown in FIGS. 21(a), 21(b), and 21(c).

As described thus far, in the NMR multiple tuning circuit and probe of the present invention, a sample coil and two inductors forming a balanced resonant circuit are connected via capacitive elements. Alternatively, a sample coil and two conductors are connected via capacitive elements. Therefore, an RF voltage developed across the sample coil and RF voltages developed across each of the two inductors or conductors are not summed up. This improves the voltage resistance of the multiple tuning circuit. Even if high RF power is injected, electric discharge is less likely to occur.

Having thus described my invention with the detail and particularity required by the Patent Laws, what is desired protected by Letters Patent is set forth in the following claims.

What is claimed is:

1. A multiple tuning circuit for use in an NMR spectrometer, said multiple tuning circuit comprising:
   a sample coil having ends A and B, said end A being grounded via a first capacitive element, said end B being grounded via a second capacitive element;
   a first inductor having a first end connected with the end A of said sample coil via a third capacitive element, said first inductor having a second end grounded;
   a second inductor having a first end connected with the end B of said sample coil via a fourth capacitive element, said second inductor having a second end grounded;
   a first set of matching circuit and tuning circuit for supplying first RF to said sample coil; and
   a second set of matching circuit and tuning circuit for supplying second RF to said sample coil,
   wherein said sample coil, first inductor, second inductor, first capacitive element, second capacitive element, third capacitive element, and fourth capacitive element together form a balanced resonant circuit where voltage amplitude becomes zero near a center point of the sample coil.

2. A multiple tuning circuit for use in an NMR spectrometer as set forth in claim 1, wherein the grounded end of said first inductor is grounded via a fifth capacitive element.

3. A multiple tuning circuit for use in an NMR spectrometer as set forth in claim 1, wherein the grounded end of said second inductor is grounded via a sixth capacitive element.

4. A multiple tuning circuit for use in an NMR spectrometer as set forth in claim 1, wherein said first set of matching circuit and tuning circuit is directly connected with one end of said sample coil.

5. A multiple tuning circuit for use in an NMR spectrometer as set forth in any one of claims 1–4, wherein said second set of matching circuit and tuning circuit is connected between said first inductor and said fifth capacitive element or between said second inductor and said sixth capacitive element.

6. A multiple tuning circuit for use in an NMR spectrometer as set forth in any one of claims 1–4, wherein at least one of said third and fourth capacitive elements is a tuning variable capacitive element for said second RF.

7. A multiple tuning circuit for use in an NMR spectrometer as set forth in any one of claims 1–4, wherein a tuning variable capacitive element for said second RF has one end connected with a junction of said sample coil and said second capacitive element and another end connected with said second inductor, and wherein a junction of said tuning variable capacitive element for said second RF and said second inductor is grounded via an eighth capacitive element for bringing said first RF into resonance.

8. A multiple tuning circuit for use in an NMR spectrometer as set forth in any one of claims 1–4, wherein,
   (A) said third capacitive element connected with the end A of said sample coil is split into at least two parts connected in series;
   (B) one end of said first capacitive element and one end of said first set of matching circuit and tuning circuit are connected with a junction of these parts connected in series;
   (C) another end of said first capacitive element and another end of said first set of matching circuit and tuning circuit are grounded;
   (D) said fourth capacitive element connected with the end B of said sample coil is split into at least two parts connected in series;
   (E) one end of said second capacitive element for bringing said first RF into resonance is connected with a junction of these parts of said fourth capacitive elements connected in series; and
   (F) another end of said second capacitive element is grounded.

9. A multiple tuning circuit for use in an NMR spectrometer as set forth in any one of claims 1–4, wherein a capacitive element of a variable or fixed capacitance is connected in parallel with at least one of said first and second inductors.

10. A multiple tuning circuit for use in an NMR spectrometer, said multiple tuning circuit comprising:

a sample coil having ends A and B;

a first inductor having a first end connected with the end A of said sample coil via first and second capacitive elements, said first inductor having a second end grounded;

a second inductor having a first end connected with the end B of said sample coil via third and fourth capacitive elements, said second inductor having a second end grounded;

one or more fifth capacitive elements for connecting a junction of said first and second capacitive elements with a junction of said third and fourth capacitive elements directly or indirectly via ground;

a first matching circuit for supplying first RF to said sample coil; and a second matching circuit for supplying second RF to said sample coil, wherein said sample coil, first inductor, second inductor, first capacitive element, second capacitive element, third capacitive element, and fourth capacitive element together form a balanced resonant circuit where an amplitude voltage becomes zero near a center point of the sample coil.

11. A multiple tuning circuit for use in an NMR spectrometer as set forth in claim 10, wherein the grounded end of said first inductor is grounded via a sixth capacitive element.

12. A multiple tuning circuit for use in an NMR spectrometer as set forth in claim 10, wherein the grounded end of said second inductor is grounded via a seventh capacitive element.

13. A multiple tuning circuit for use in an NMR spectrometer as set forth in any one of claims 10–12, wherein at least one of said first through fourth capacitive elements is a tuning variable capacitive element for said second RF.

14. A multiple tuning circuit for use in an NMR spectrometer as set forth in any one of claims 10–12, wherein at least one of said fifth capacitive elements is a tuning variable capacitive element for said first RF.

15. A multiple tuning circuit for use in an NMR spectrometer as set forth in any one of claims 10–12, wherein a capacitive element having a fixed or variable capacitance is connected in parallel with at least one of said first and second inductors.

16. A multiple tuning circuit for use in an NMR spectrometer as set forth in any one of claims 1–4 and 10–12 for analysis of a sample having at least two resonating nuclei resonating at different frequencies, said first RF being the frequency of one resonating nuclei which is higher in frequency than said second RF being the resonant frequency of another resonating nuclei.

17. A multiple tuning circuit for use in an NMR spectrometer, said multiple tuning circuit comprising:

a sample coil having ends A and B;

a second inductor having a first end connected with the end A of said sample coil via a first capacitive element, a first inductor, and a second capacitive element, said second inductor having a second end grounded;

a fourth inductor having a first end connected with the end B of said sample coil via a third capacitive element, a third inductor, and a fourth capacitive element, said fourth inductor having a second end grounded;

one or more fifth capacitive elements for connecting a junction of said first inductor and said second capacitive element with a junction of said third inductor and said fourth capacitive element directly or indirectly via ground;

a first matching circuit for supplying first RF to said sample coil;

a second matching circuit for supplying second RF to said sample coil; and a third matching circuit for supplying third RF to said sample coil, wherein said sample coil, first inductor, second inductor, third inductor, fourth inductor, first capacitive element, second capacitive element, third capacitive element, and fourth capacitive element together form a balanced resonant circuit where an amplitude voltage becomes zero near a center point of said sample coil.

18. A multiple tuning circuit for use in an NMR spectrometer as set forth in claim 17, wherein the grounded end of said second inductor is grounded via a sixth capacitive element.

19. A multiple tuning circuit for use in an NMR spectrometer as set forth in claim 17, wherein the grounded end of said fourth inductor is grounded via a seventh capacitive element.

20. A multiple tuning circuit for use in an NMR spectrometer as set forth in any one of claims 17–19, wherein at least one of said first through fourth capacitive elements is a tuning variable capacitive element for said second RF.

21. A multiple tuning circuit for use in an NMR spectrometer as set forth in any one of claims 17–19, wherein at least one capacitive element of said fifth capacitive elements is a tuning variable capacitive element for said first RF.

22. A multiple tuning circuit for use in an NMR spectrometer as set forth in any one of claims 17–19, wherein a tuning capacitive element for said third RF is formed at least in a given position in said first inductor or in a given position in said third inductor.

23. A multiple tuning circuit for use in an NMR spectrometer as set forth in any one of claims 17–19, wherein a capacitive element having a variable or fixed capacitance is connected in parallel with at least one of said second and fourth inductors.

24. A multiple tuning circuit for use in an NMR spectrometer as set forth in any one of claims 17–19, wherein a band-reject filter for rejecting said second RF is inserted between an input terminal for said first RF and a matching capacitive element.

25. A multiple tuning circuit for use in an NMR spectrometer as set forth in any one of claims 17–19, wherein a band-reject filter for rejecting said first RF is inserted between an input terminal for said second RF and a matching capacitive element.

26. A multiple tuning circuit for use in an NMR spectrometer as set forth in any one of claims 17–19 for a sample having three resonating nuclei having different resonant frequencies, said third RF being the resonant frequency of the nucleus which has the highest resonant frequency of the three resonating nuclei, the second RF being the resonant frequency of the nucleus which has the lowest resonant frequency of the three resonating nuclei.

27. A probe for use in an NMR spectrometer, said probe including a multiple tuning circuit, said multiple tuning circuit comprising:

a sample coil having ends A and B, said end A being grounded via a first capacitive element, said end B being grounded via a second capacitive element;

a first inductor having a first end connected with the end A of said sample coil via a third capacitive element, said first inductor having a second end grounded;

a second inductor having a first end connected with the end B of said sample coil via a fourth capacitive element, said second inductor having a second end grounded;

a first set of matching circuit and tuning circuit for supplying first RF to said sample coil;

a second set of matching circuit and tuning circuit for supplying second RF to said sample coil; and an electrical circuit portion whose outside is surrounded by a cylindrical electrode that is used as a grounding electrode of the multiple tuning circuit.

28. A probe for use in an NMR spectrometer, said probe including a multiple tuning circuit, said multiple tuning circuit comprising:

a sample coil having ends A and B;

a first inductor having a first end connected with the end A of said sample coil via first and second capacitive elements, said first inductor having a second end grounded;

a second inductor having a first end connected with the end B of said sample coil via third and fourth capacitive elements, said second inductor having a second end grounded;

one or more fifth capacitive elements for connecting a junction of said first and second capacitive elements with a junction of said third and fourth capacitive elements directly or indirectly via ground;

a first matching circuit for supplying first RF to said sample coil;

a second matching circuit for supplying second RF to said sample coil; and an electrical circuit portion surrounded by a cylindrical electrode that is used as a grounding electrode of the multiple tuning circuit.

29. A probe for use in an NMR spectrometer, said probe including a multiple tuning circuit, said multiple tuning circuit comprising:

a sample coil having ends A and B;

a second inductor having a first end connected with the end A of said sample coil via a first capacitive element, a first inductor, and a second capacitive element, said second inductor having a second end grounded;

a fourth inductor having a first end connected with the end B of said sample coil via a third capacitive element, a third inductor, and a fourth capacitive element, said fourth inductor having a second end grounded;

one or more fifth capacitive elements for connecting a junction of said first inductor and said second capacitive element with a junction of said third and fourth capacitive elements directly or indirectly via ground;

a first matching circuit for supplying first RF to said sample coil;

a second matching circuit for supplying second RF to said sample coil;

a third matching circuit for supplying third RF to said sample coil; and an electrical circuit portion whose outside is surrounded by a cylindrical electrode that is used as a grounding electrode of the multiple tuning circuit.

30. A probe for use in an NMR spectrometer as set forth in any one of claims 27–29, wherein said cylindrical electrode has a window in a given position to place the inside of the probe in communication with the outside.

31. A magic angle spinning probe for use in an NMR spectrometer, said probe comprising:

a sample coil having ends A and B;

a first capacitor having a first end connected with the end A of said sample coil, said first capacitor having a second end grounded; and a second capacitor having a first end connected with the end B of said sample coil, said second capacitor having a second end grounded;

wherein said sample coil, first capacitor, and second capacitor together form a balanced resonant circuit for bringing an RF amplitude voltage near a center point of said sample coil to zero; and wherein said probe has an electrical circuit portion whose outside is surrounded by a cylindrical electrode that is used as a grounding electrode of this electrical circuit portion.

32. A probe for use in an NMR spectrometer as set forth in claim 31, wherein said cylindrical electrode has a window in a given position to place the inside of the probe in communication with the outside.

* * * * *